United States Patent
Zhang et al.

(10) Patent No.: US 12,302,634 B2
(45) Date of Patent: May 13, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Kui Zhang, Hefei (CN); Zhan Ying, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 549 days.

(21) Appl. No.: 17/647,871

(22) Filed: Jan. 13, 2022

(65) Prior Publication Data

US 2022/0310597 A1    Sep. 29, 2022

Related U.S. Application Data

(63) Continuation of application No. PCT/CN2021/112900, filed on Aug. 17, 2021.

(30) Foreign Application Priority Data

Mar. 29, 2021  (CN) .......................... 202110334233.5

(51) Int. Cl.
   *H10D 84/85*   (2025.01)
   *H01L 25/07*   (2006.01)
   (Continued)

(52) U.S. Cl.
   CPC ......... *H10D 84/856* (2025.01); *H01L 25/074* (2013.01); *H10D 84/0172* (2025.01);
   (Continued)

(58) Field of Classification Search
   CPC ............. H01L 27/0922; H01L 27/0688; H01L 27/092; H01L 21/823828; H01L 21/8221;
   (Continued)

(56) References Cited

U.S. PATENT DOCUMENTS 9,419,003 B1 * 8/2016 Colinge ............ H01L 29/41741
10,049,946 B2    8/2018 Oxland
(Continued)

FOREIGN PATENT DOCUMENTS

CN         1592969 A      3/2005
CN       101090121 A     12/2007
(Continued)

OTHER PUBLICATIONS

International Search Report cited in PCT/CN2021/111900 mailed Dec. 30, 2021, 9 pages.
(Continued)

*Primary Examiner* — Michael M Trinh
(74) *Attorney, Agent, or Firm* — Kilpatrick Townsend & Stockton LLP

(57) ABSTRACT

The present disclosure relates to the technical field of semiconductors, and provides a semiconductor structure and a manufacturing method thereof. The semiconductor structure includes: a substrate; a first transistor, located on the substrate; a second transistor, located above the first transistor; and a gate structure, the gate structure including a first gate layer and a second gate layer, which connected to each other, the first gate layer surrounding the first transistor and the second gate layer surrounding the second transistor; an extension direction of the first transistor and an extension direction of the second transistor are both perpendicular to the substrate.

9 Claims, 24 Drawing Sheets

(51) Int. Cl.
    *H10D 84/01*      (2025.01)
    *H10D 84/03*      (2025.01)
    *H10D 88/00*      (2025.01)

(52) U.S. Cl.
    CPC ....... *H10D 84/0195* (2025.01); *H10D 84/038* (2025.01); *H10D 84/85* (2025.01); *H10D 88/00* (2025.01); *H10D 88/01* (2025.01)

(58) Field of Classification Search
    CPC ..... H01L 21/823807; H01L 21/823885; H01L 21/823871; H10D 84/856; H10D 84/038; H10D 84/01; H10D 84/85; H10D 84/851; H10D 84/852; H10D 84/0195; H10D 84/0172; H10D 84/0167; H10D 84/0186; H10D 84/017; H10D 84/8311; H10D 84/8312; H10D 84/83135; H10D 84/83138; H10D 84/8314; H10D 84/8316; H10D 84/835; H10D 84/836; H10D 84/837; H10D 84/839
    See application file for complete search history.

(56) References Cited

U.S. PATENT DOCUMENTS

| | | | |
|---|---|---|---|
| 10,115,438 | B2 | 10/2018 | Ingalls et al. |
| 10,115,641 | B2 | 10/2018 | Zhu |
| 10,629,538 | B2 | 4/2020 | Zhang |
| 2005/0121727 | A1 | 6/2005 | Ishitsuka et al. |
| 2007/0290232 | A1 | 12/2007 | Nishiyama |
| 2015/0364486 | A1 | 12/2015 | Koval |
| 2017/0033021 | A1* | 2/2017 | Oxland ............. H01L 21/02532 |
| 2018/0090387 | A1 | 3/2018 | Jacob |
| 2019/0378854 | A1 | 12/2019 | Lee et al. |
| 2020/0203343 | A1 | 6/2020 | Zhu et al. |
| 2020/0212226 | A1 | 7/2020 | Reznicek et al. |
| 2020/0335581 | A1 | 10/2020 | Li et al. |
| 2020/0350326 | A1 | 11/2020 | Yun et al. |
| 2021/0036146 | A1 | 2/2021 | Zhou |
| 2021/0296316 | A1 | 9/2021 | Zhu |
| 2021/0366916 | A1* | 11/2021 | Ye ................... H01L 29/42392 |

FOREIGN PATENT DOCUMENTS

| | | |
|---|---|---|
| CN | 105895635 A | 8/2016 |
| CN | 106252352 A | 12/2016 |
| CN | 106298792 A | 1/2017 |
| CN | 106449596 A | 2/2017 |
| CN | 109196584 A | 1/2019 |
| CN | 109449158 A | 3/2019 |
| CN | 109830483 A | 5/2019 |
| CN | 109841675 A | 6/2019 |
| CN | 110808247 A | 2/2020 |
| CN | 111883534 A | 11/2020 |
| CN | 112309860 A | 2/2021 |
| CN | 112310042 A | 2/2021 |
| CN | 113078154 A | 7/2021 |
| CN | 113078155 A | 7/2021 |
| CN | 113078156 A | 7/2021 |
| JP | 2007059680 A | 3/2007 |
| JP | 2007250652 A | 9/2007 |

OTHER PUBLICATIONS

International Search Report cited in PCT/CN2021/112012 mailed Dec. 30, 2021, 10 pages.
International Search Report cited in PCT/CN2021/121375 mailed Jan. 7, 2022, 4 pages.
International Search Report cited in PCT/CN2021/110887 mailed Jan. 5, 2022, 10 pages.
"Will CFETs be chosen to be the transistors in the future?", http://news.moore.ren/industry/225676.htm, May 28, 2020, 7 pages.
International Search Report cited in PCT/CN2021/112900 mailed Jan. 6, 2022, 9 pages.

* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2021/112900, filed on Aug. 17, 2021, which claims the priority to Chinese Patent Application 202110334233.5, titled "SEMICONDUCTOR STRUCTURE AND MANUFACTURING METHOD THEREOF" and filed on Mar. 29, 2021. The entire contents of International Application No. PCT/CN2021/112900 and Chinese Patent Application 202110334233.5 are incorporated herein by reference.

TECHNICAL FIELD

The present disclosure relates to the technical field of semiconductors, and in particular to a semiconductor structure and a manufacturing method thereof.

BACKGROUND

NFETs and PFETs of the semiconductor structure in the related art are horizontally placed wrap-around gate transistors. The horizontally arranged conductive channels occupy a long area in the horizontal direction, limiting the development of the semiconductor structure.

SUMMARY

The present disclosure provides a semiconductor structure and a manufacturing method thereof.

According to some embodiments, a first aspect of the present disclosure provides a semiconductor structure, including:
  a substrate;
  a first transistor, located on the substrate;
  a second transistor, located above first transistor; and
  a gate structure, the gate structure including a first gate layer and a second gate layer, which connected to each other, the first gate layer surrounding the first transistor, and the second gate layer surrounding the second transistor;
  wherein an extension direction of the first transistor and an extension direction of the second transistor are both perpendicular to the substrate.

According to some embodiments, a second aspect of the present disclosure provides a method of manufacturing a semiconductor structure, including:
  providing a substrate;
  forming a first transistor on the substrate;
  forming a second transistor above the first transistor; and
  forming a gate structure on a circumference of the first transistor and a circumference of the second transistors, the gate structure including a first gate layer and a second gate layer connected to each other, the first gate layer surrounding the first transistor, and the second gate layer surrounding the second transistor;
  wherein an extension direction of the first transistor and an extension direction of the second transistor are both perpendicular to the substrate.

BRIEF DESCRIPTION OF THE DRAWINGS

The preferred embodiments of the present disclosure are described in detail below with reference to the accompanying drawings to make the objectives, features and advantages of the present disclosure more obvious. The drawings are merely exemplary illustrations of the present disclosure, and are not necessarily drawn to scale. The same reference numerals in the drawings always represent the same parts. In the drawings.

DETAILED DESCRIPTION

Figure 1:
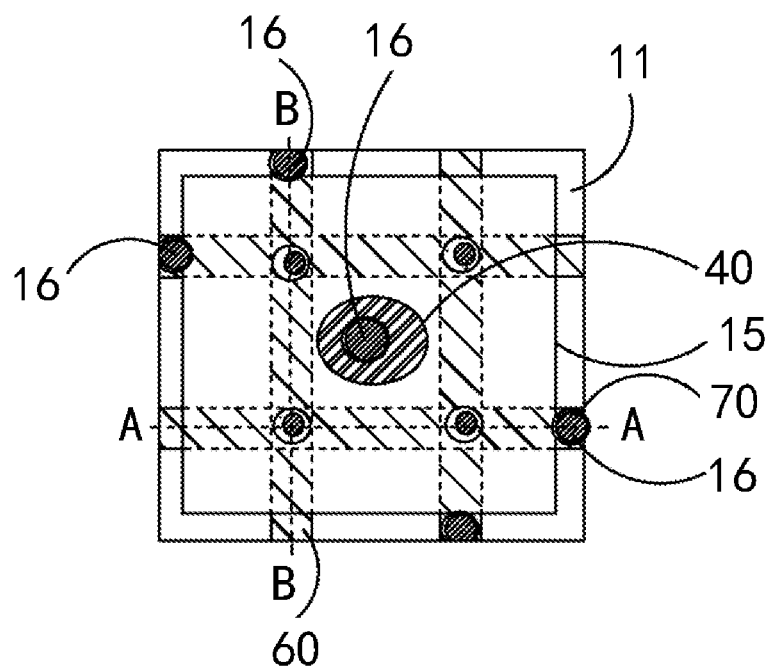
FIG. 1 is a top view of a semiconductor structure according to a first exemplary embodiment.

The typical embodiments embodying the features and advantages of the present disclosure are described in detail below. It should be understood that the present disclosure may have various changes in different embodiments, which do not depart from the scope of the present disclosure. The description and drawings herein are essentially used for the purpose of explanation, rather than limiting the present disclosure.

Different exemplary embodiments of the present disclosure are described below with reference to the accompanying drawings. The accompanying drawings form a part of the present disclosure, which show by way of example different exemplary structures, systems and steps that can implement various aspects of the present disclosure. It should be understood that other specific solutions of components, structures, exemplary devices, systems and steps may be used, and structural and functional modifications may be made without departing from the scope of the present disclosure. Moreover, although the terms such as "above", "between" and "within" may be used in this specification to describe different exemplary features and elements of the present disclosure, these terms are used herein only for convenience of description, for example, according to the directions of the examples in the drawings. Nothing in this specification should be understood as requiring a specific three-dimensional direction of the structure to fall within the scope of the present disclosure.

An embodiment of the present disclosure provides a manufacturing method of a semiconductor structure. As shown in FIG. 1 to FIG. 45, the method of manufacturing a semiconductor structure includes:

S101: Provide a substrate 10.

S103: Form first transistors 20 on the substrate 10.

S105: Form second transistors 30 above the first transistors 20 respectively.

S107: Form gate structures 40 on the circumferences of the first transistors 20 and the second transistors 30, where each of the gate structures 40 includes a first gate layer 41 and a second gate layer 42 connected to each other, the first gate layers 41 surround the first transistors 20 respectively, and the second gate layers 42 surround the second transistors 30 respectively.

An extension direction of each of the first transistors 20 and an extension direction of each of the second transistors 30 are both perpendicular to the substrate 10.

In the method of manufacturing a semiconductor structure according to an embodiment of the present disclosure, the first transistor 20 and the second transistor 30 stacked in a vertical direction are formed on the substrate 10; in addition, the first transistor 20 and the second transistor 30 share the gate structure 40, which increases the length of a conductive channel of the semiconductor structure and also reduces the area occupied by the semiconductor structure, thus improving the performance of the semiconductor structure.

It should be noted that, the second transistor 30 being formed above the first transistor 20 may be construed as at least a part of the second transistor 30 being located above the first transistor 20. That is, the top of the first transistor 20 may be flush with the bottom of the second transistor 30, or the top of the first transistor 20 may be higher than the bottom of the second transistor 30, that is, a part of the second transistor 30 is located above the first transistor 20, or the top of the first transistor 20 is lower than the bottom of the second transistor 30. A position above the first transistor 20 may be a position right above the first transistor 20 or may be a position deviated from the position right above the first transistor 20.

The first transistor 20 and the second transistor 30 are stacked in the vertical direction. An extension direction of the first transistor 20 and an extension direction of the second transistor 30 are both the vertical direction. That is, the vertical direction is a direction perpendicular to the substrate 10. In this case, the substrate 10 may be interpreted as a horizontally placed structure, which is similar to a horizontal plane as a whole.

The first transistor 20 and the second transistor 30 share the gate structure 40. That is, the first transistor 20, the second transistor 30, and the gate structure 40 form a complementary transistor structure. Optionally, each of the first transistors 20 is a PFET, and each of the second transistors 30 is an NFET; or each of the first transistors 20 is an NFET, and each of the second transistors 30 is a PFET. The first transistor 20, the second transistor 30 and the gate structure 40 form a complementary FET (CFET) structure.

Optionally, each of the gate structures 40 includes a first gate layer 41, a second gate layer 42, and a gate connection layer 43. Two ends of the gate connection layer 43 are connected to the first gate layer 41 and the second gate layer 42, thus forming the gate structure 40 shared by the first transistor 20 and the second transistor 30.

The substrate 10 may be made of a silicon-containing material. The substrate 10 may be made of any suitable material, including, for example, at least one of silicon, monocrystalline silicon, polysilicon, amorphous silicon, silicon-germanium, monocrystalline silicon-germanium, polycrystalline silicon-germanium, or carbon-doped silicon.

In an embodiment, the method of manufacturing a semiconductor structure further includes: before forming the second transistors 30, forming first conductive layers 60 above the first transistors 20 respectively, where a plane in which an extension direction of each of the first conductive layers 60 is located is parallel to the substrate 10; at least a part of each of the second transistors 30 is formed above each of the first conductive layers 60 and is connected to the first conductive layer 60. The first transistor 20 and the second transistor 30 are connected through the first conductive layer 60. The first conductive layer 60 may be used as a lead wire; drain regions or source regions of the first transistor 20 and the second transistor 30 may be led out through the first conductive layer 60. The first transistor 20 and the second transistor 30 may share a drain region or a source region, which is not limited therein. The thickness of the first conductive layer 60 can ensure the formation of the drain region or source region in the first conductive layer 60.

In an embodiment, the method of manufacturing a semiconductor structure further includes: forming through holes 65 in the first conductive layers 60 respectively, to expose the first transistors 20 respectively; and forming a conductive connection layer 50 in each of the through holes 65, wherein the second transistor 30 is formed above the conductive connection layer 50 and is connected to the conductive connection layer 50. The second transistor 30 may be located right above the first transistor 20. That is, projection of the first transistor 20 and projection of the second transistor 30 on the substrate 10 at least partially overlap. The conductive connection layer 50 can prevent direct contact between the first transistor 20 and the second transistor 30. In this case, the first transistor 20, the conductive connection layer 50, and the second transistor 30 are sequentially stacked from bottom to top.

In an embodiment, at least one of the first transistor 20 and the first conductive layer 60 is formed through epitaxial growth. Optionally, the first transistors 20 and the first conductive layers 60 are directly formed on the substrate 10 through epitaxial growth, to reduce the process difficulty and improve the forming efficiency of the semiconductor structure.

In an embodiment, the method of manufacturing a semiconductor structure further includes: before forming the first transistors 20, forming second conductive layers 70 in the substrate 10, where at least a part of each of the first transistors 20 is formed above each of the second conductive layer 70 and is connected to the second conductive layer 70. That is, the second conductive layer 70 is used as a lead wire, to lead out the drain region or source region of the first transistor 20.

Optionally, the first transistor 20 and the second transistor 30 may share the drain region or source region. In this case, the source region or drain region at the bottom of the first transistor 20 may be led out through the second conductive layer 70, and the source region or drain region at the top of the second transistor 30 may be led out directly, e.g., directly connected to conductive contact holes 16; the first conductive layer 60 and the second conductive layer 70 are connected to the conductive contact holes 16 respectively.

In an embodiment, second openings 74 are formed on the second conductive layer 70, and a part of each of the first transistors 20 is formed in each of the second openings 74. Optionally, in the process of forming the first transistors 20, the second openings 74 may be first formed on the second conductive layers 70 respectively, and the first transistors 20 start to be formed in the substrate 10 through epitaxial growth.

Figure 2:
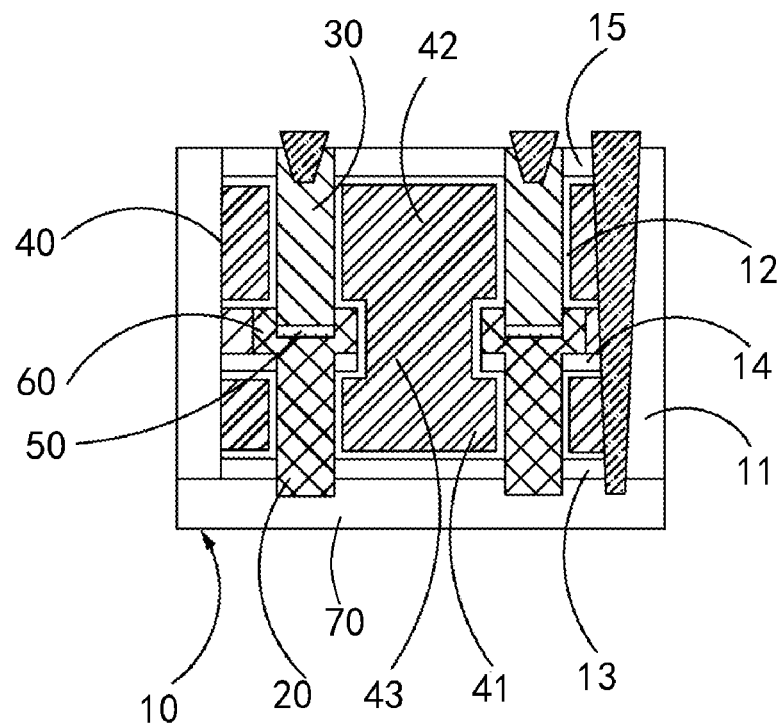
FIG. 2 is a schematic structural diagram of a cross section taken along A-A in FIG. 1.
Figure 3:
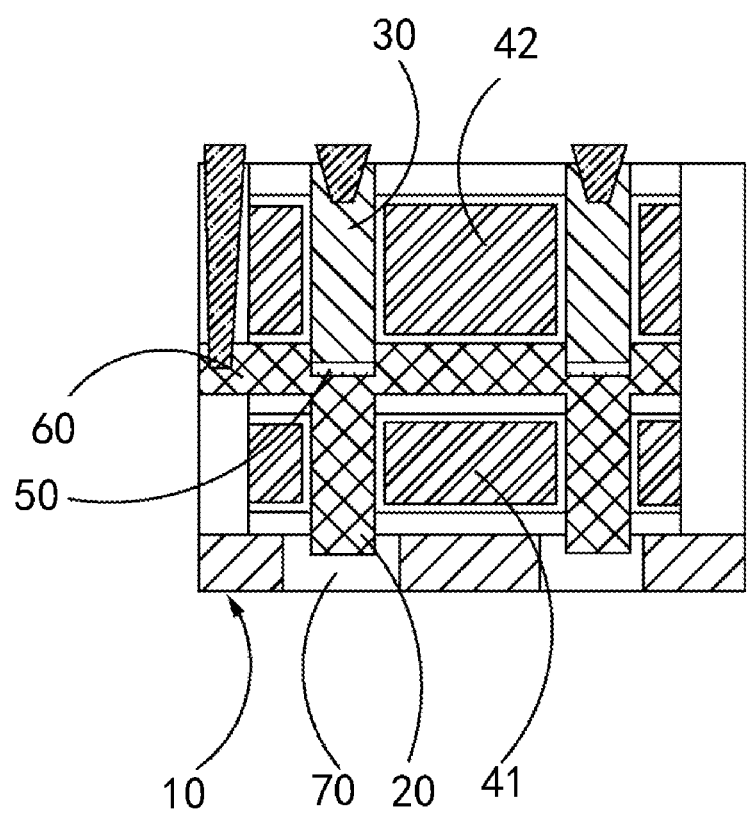
FIG. 3 is a schematic structural diagram of a cross section taken along B-B in FIG. 1.
Figure 4:
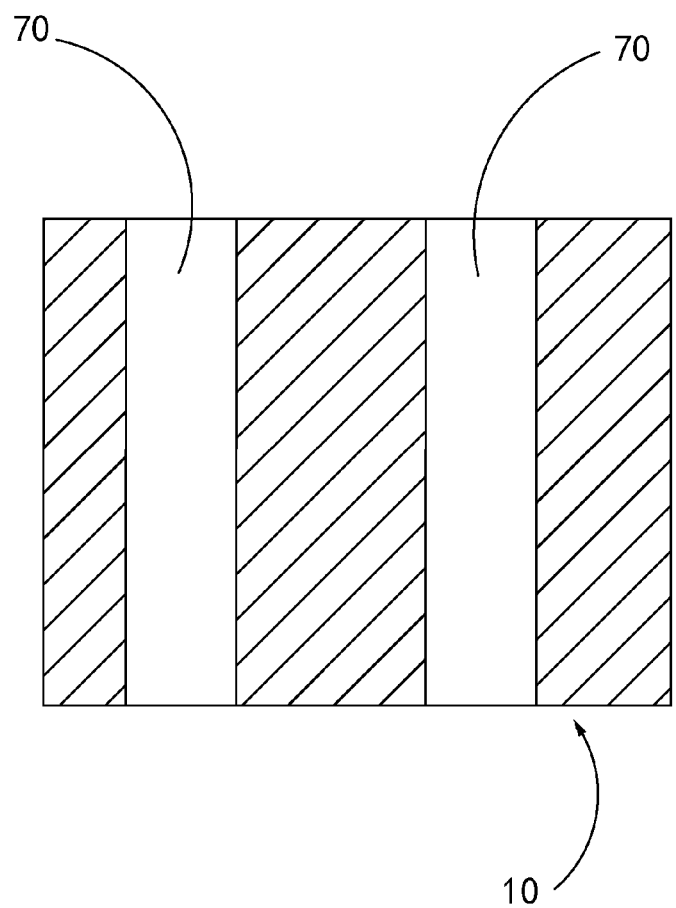
FIG. 4 is a schematic structural diagram of forming second conductive layers in a method of manufacturing a semiconductor structure according to a first exemplary embodiment.

In the first embodiment of the method of manufacturing a semiconductor structure, a semiconductor structure as shown in FIG. 1 to FIG. 3 is formed. The method of manufacturing a semiconductor structure includes steps as follows:

A substrate 10 is provided, and patterned etching is performed to form first wires, that is, second conductive layers 70 as shown in FIG. 4 are formed. Optionally, an insulation material is filled between the first wires.

Figure 5:
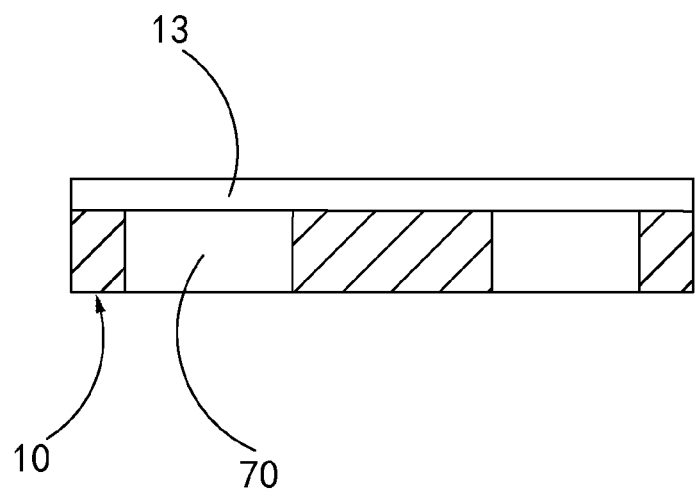
FIG. 5 is a schematic structural diagram of forming a first isolation layer in a method of manufacturing a semiconductor structure according to a first exemplary embodiment.

A first isolation layer 13 as shown in FIG. 5 is formed above the substrate 10 and the first wires. The first isolation layer 13 covers the substrate 10 and the second conductive layers 70. The first isolation layer 13 may be formed by using a physical vapor deposition (PVD) process, a chemical vapor deposition (CVD) process, an atomic layer deposition (ALD) process, etc.

Figure 6:
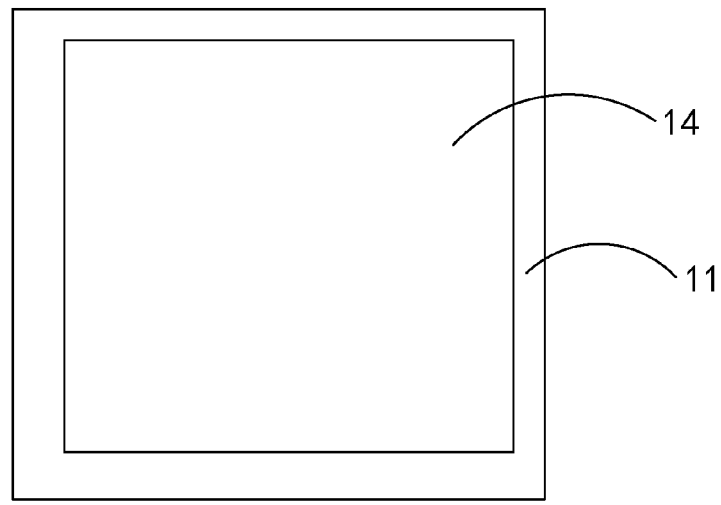
FIG. 6 is a top view of forming a second isolation layer in a method of manufacturing a semiconductor structure according to a first exemplary embodiment.
Figure 7:
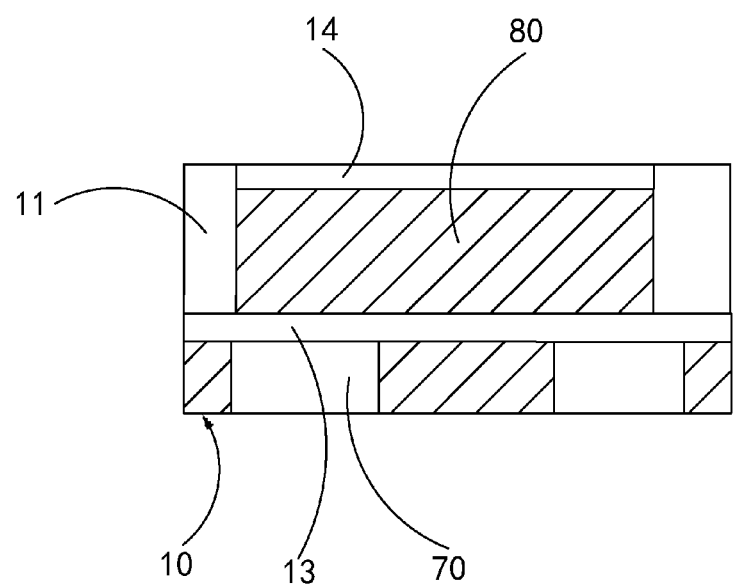
FIG. 7 is a schematic structural diagram of forming a second isolation layer in a method of manufacturing a semiconductor structure according to a first exemplary embodiment.

A protective layer 11 is formed on the first isolation layer 13, and a first sacrificial layer 80 and a second isolation layer 14 are formed in the protective layer 11, as shown in FIG. 6 and FIG. 7. The protective layer 11, the first sacrificial layer 80, and the second isolation layer 14 may all be formed through a PVD process, a CVD process, an ALD process, etc.

Figure 8:
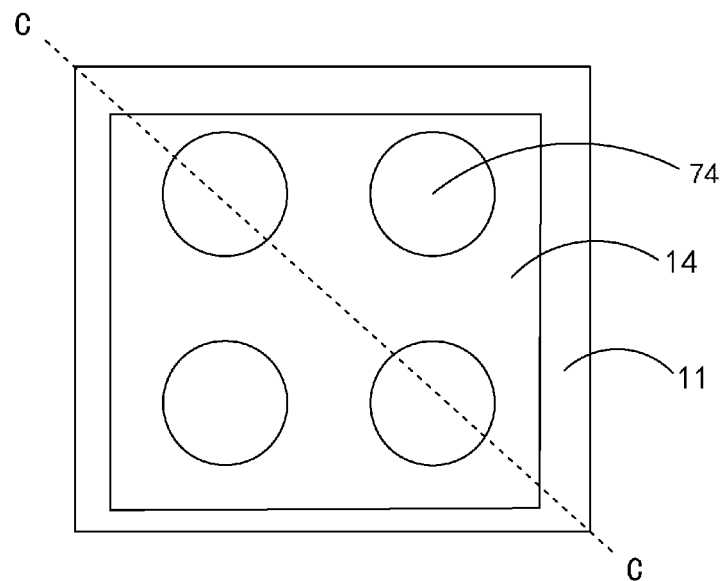
FIG. 8 is a top view of forming second openings in a method of manufacturing a semiconductor structure according to a first exemplary embodiment.
Figure 9:
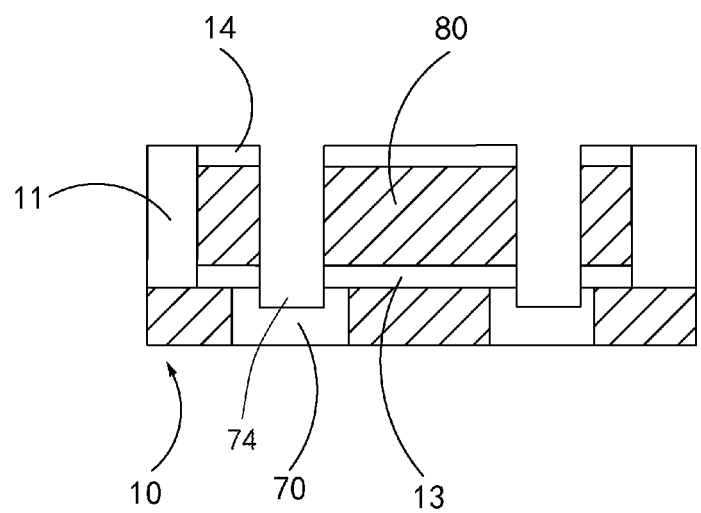
FIG. 9 is a schematic structural diagram of a cross section taken along C-C in FIG. 8.

Patterned etching is performed to form through holes penetrating the second isolation layer 14, the first sacrificial layer 80, and the first isolation layer 13, and the through holes reach the interior of the substrate 10, so as to form second openings 74 in the second conductive layers 70, as shown in FIG. 8 and FIG. 9.

Figure 10:
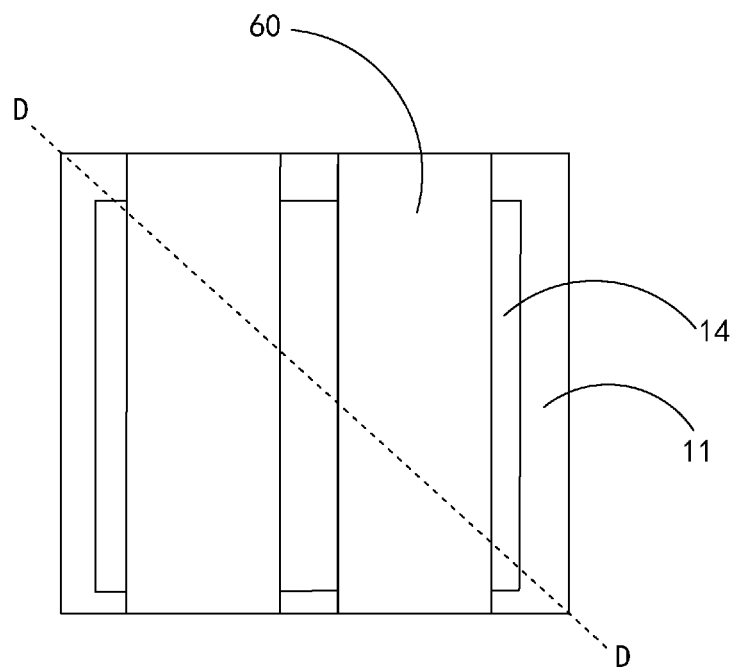
FIG. 10 is a top view of forming first conductive layers in a method of manufacturing a semiconductor structure according to a first exemplary embodiment.
Figure 11:
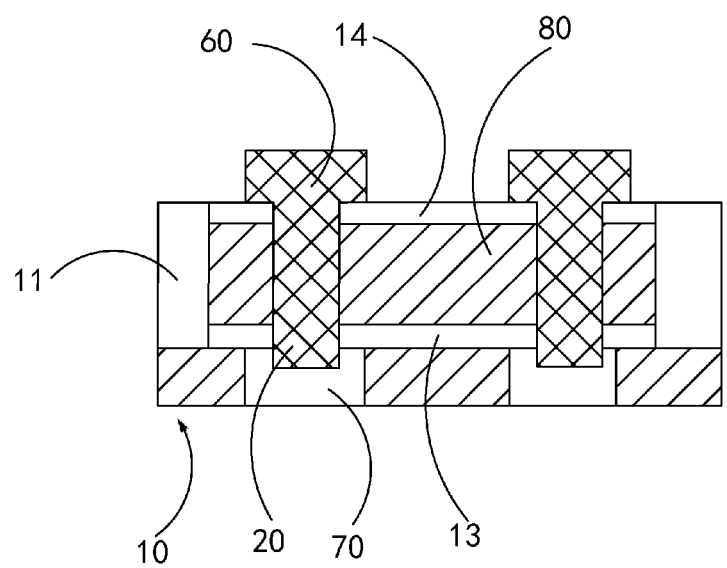
FIG. 11 is a schematic structural diagram of a cross section taken along D-D in FIG. 10.

First transistors 20 are formed through epitaxial growth, or a drain region and a source region may be formed in the first isolation layer 13 and the second isolation layer 14. Second wires, i.e., first conductive layers 60, are formed through epitaxial growth, as shown in FIG. 10 and FIG. 11. In the process of forming the first conductive layers 60, auxiliary processes such as CMP smoothing and patterned etching can be used. Each of the first conductive layers 60 and each of the second conductive layers 70 are perpendicular to each other or at a certain angle; an isolation layer may also be deposited on a top surface of each of the first conductive layers 60.

Figure 12:
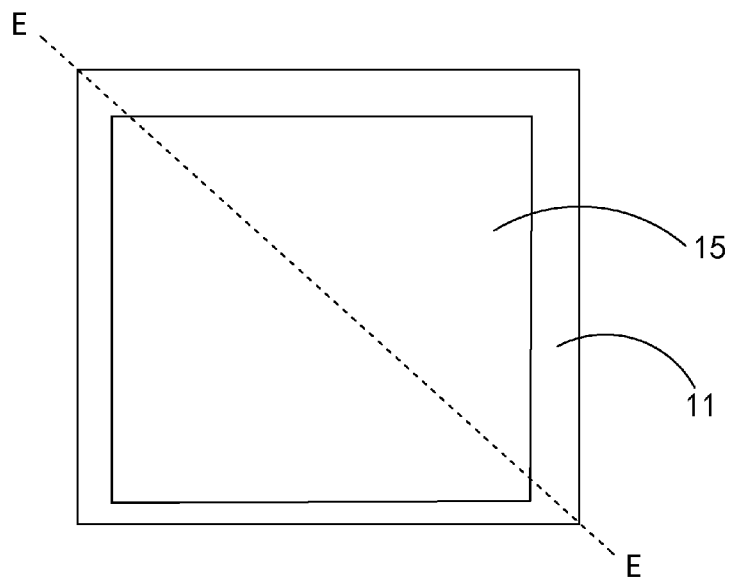
FIG. 12 is a top view of forming a third isolation layer in a method of manufacturing a semiconductor structure according to a first exemplary embodiment.
Figure 13:
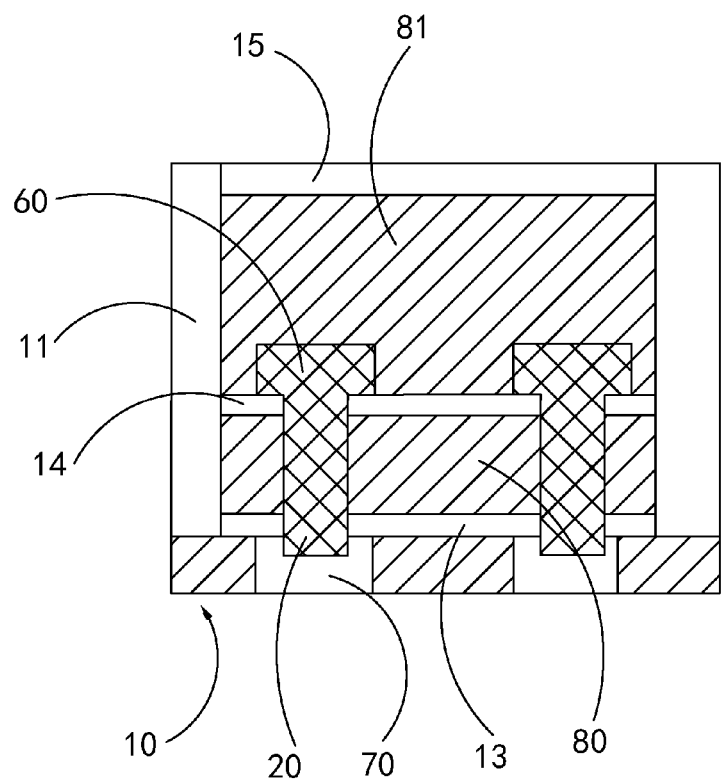
FIG. 13 is a schematic structural diagram of a cross section taken along E-E in FIG. 12.

A second sacrificial layer 81 is formed, where the second sacrificial layer 81 covers the first conductive layers 60 and the second isolation layer 14, and a third isolation layer 15 is formed on the second sacrificial layer 81, where the second sacrificial layer 81 and the third isolation layer 15 are both located in the protective layer 11, as shown in FIG. 12 and FIG. 13.

Figure 14:
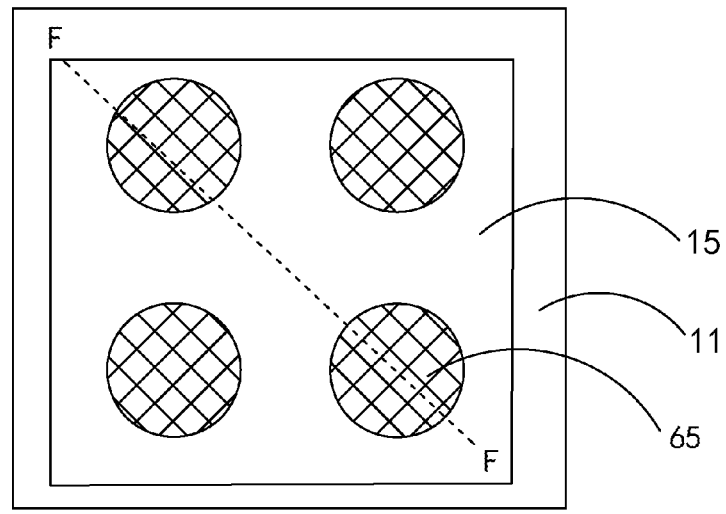
FIG. 14 is a top view of forming through holes in a method of manufacturing a semiconductor structure according to a first exemplary embodiment.
Figure 15:
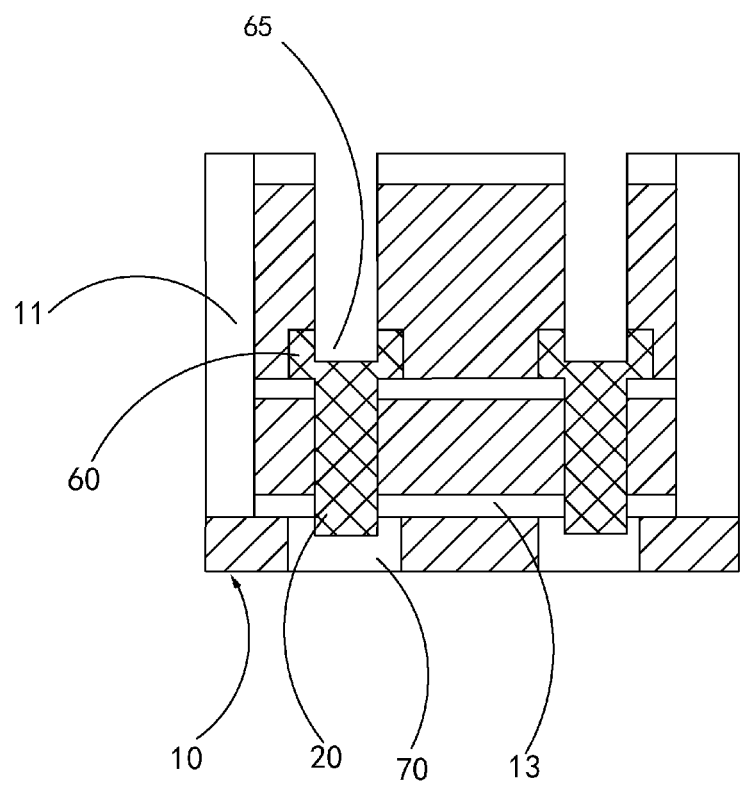
FIG. 15 is a schematic structural diagram of a cross section taken along F-F in FIG. 14.

Patterned etching is performed to form through holes penetrating the third isolation layer 15 and the second sacrificial layer 81, where each of the through holes runs through a part of the corresponding first conductive layer 60 so as to expose the top of the first transistor 20. That is, the through holes 65 are formed in the first conductive layers 60 respectively, as shown in FIG. 14 and FIG. 15.

Figure 16:
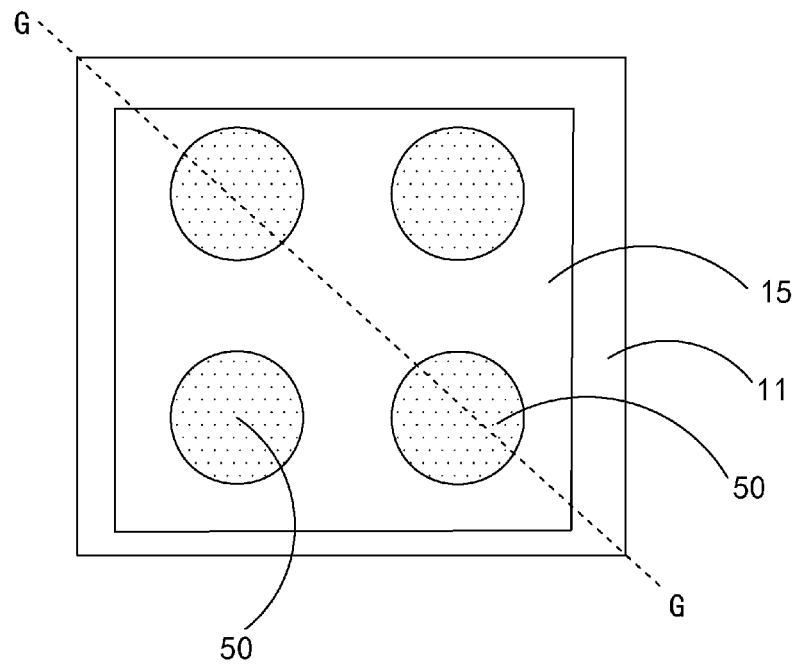
FIG. 16 is a top view of forming conductive connection layers in a method of manufacturing a semiconductor structure according to a first exemplary embodiment.
Figure 17:
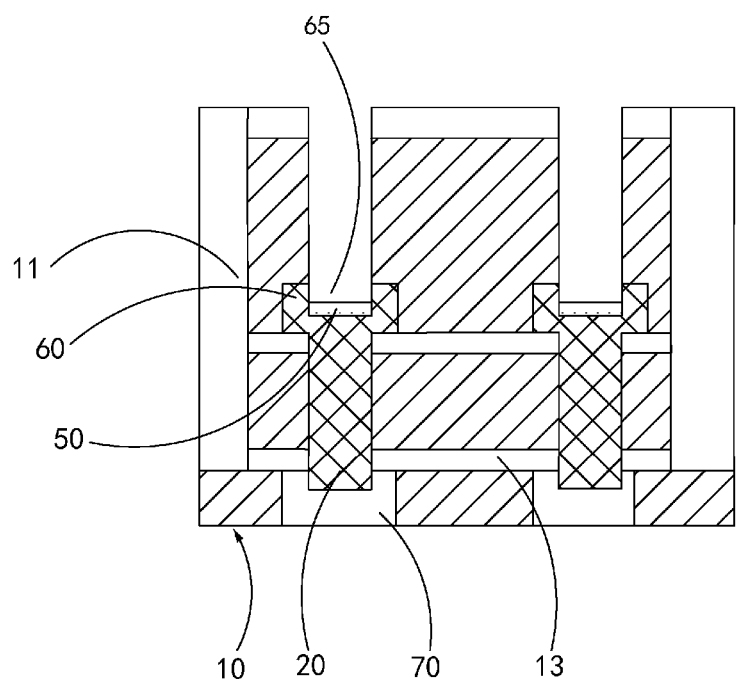
FIG. 17 is a schematic structural diagram of a cross section taken along G-G in FIG. 16.

A conductive connection layer 50 is formed in each of the through holes 65, where the conductive connection layer 50 is used as a buffer layer, that is, the conductive connection layer 50 is used for covering the top of the first transistor 20, as shown in FIG. 16 and FIG. 17. The conductive connection layer 50 should not be too thick, and the height thereof in the through hole 65 does not exceed ⅓ of the thickness of the first conductive layer 60.

Figure 18:
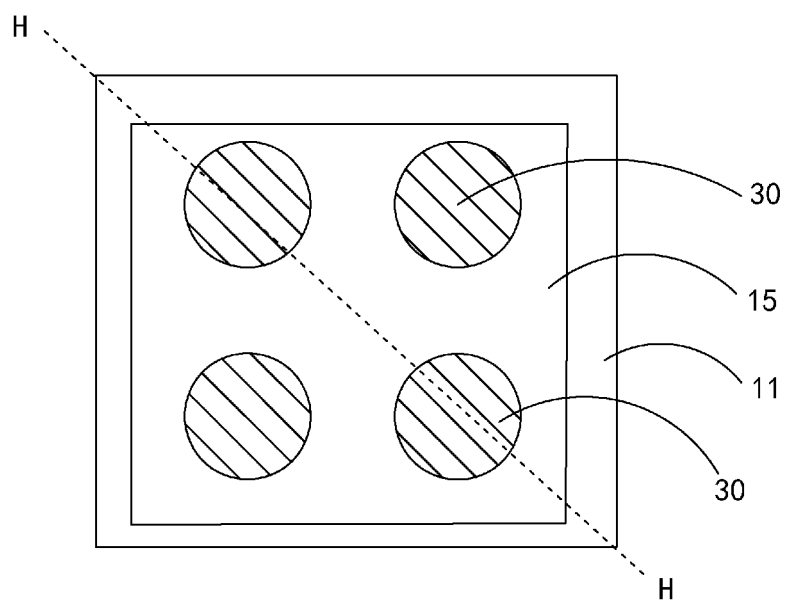
FIG. 18 is a top view of forming second transistors in a method of manufacturing a semiconductor structure according to a first exemplary embodiment.
Figure 19:
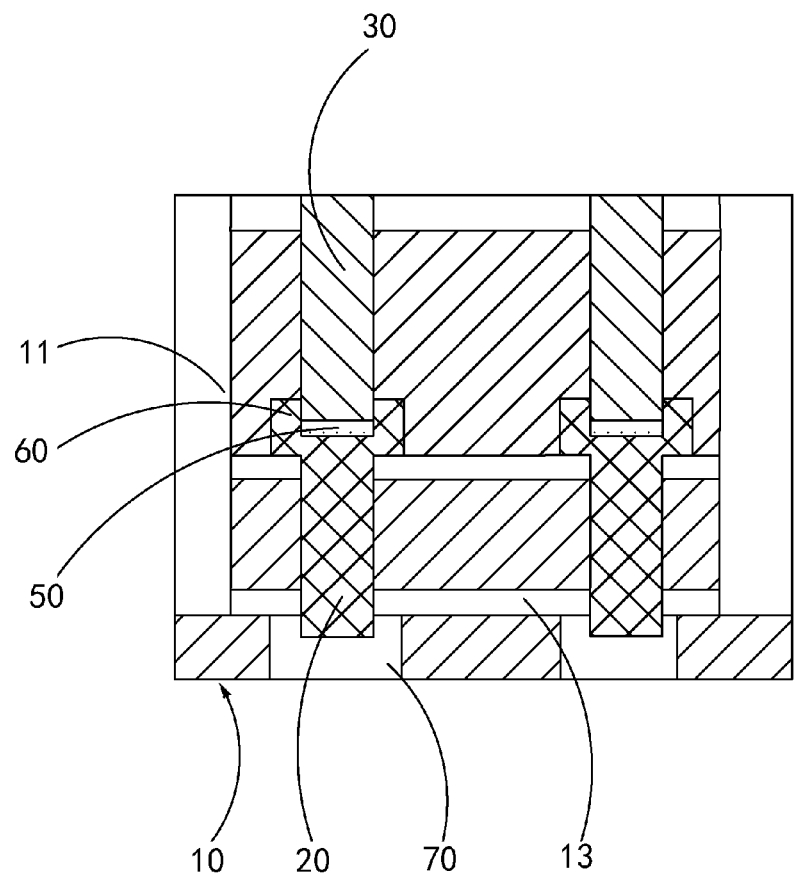
FIG. 19 is a schematic structural diagram of a cross section taken along H-H in FIG. 18.

Second transistors 30 are formed above the conductive connection layers 50 respectively through in-situ doping or deposition followed by doping. In this case, the top of each of the second transistors 30 is flush with an upper surface of the third isolation layer 15, specifically as shown in FIG. 18 and FIG. 19.

Figure 20:
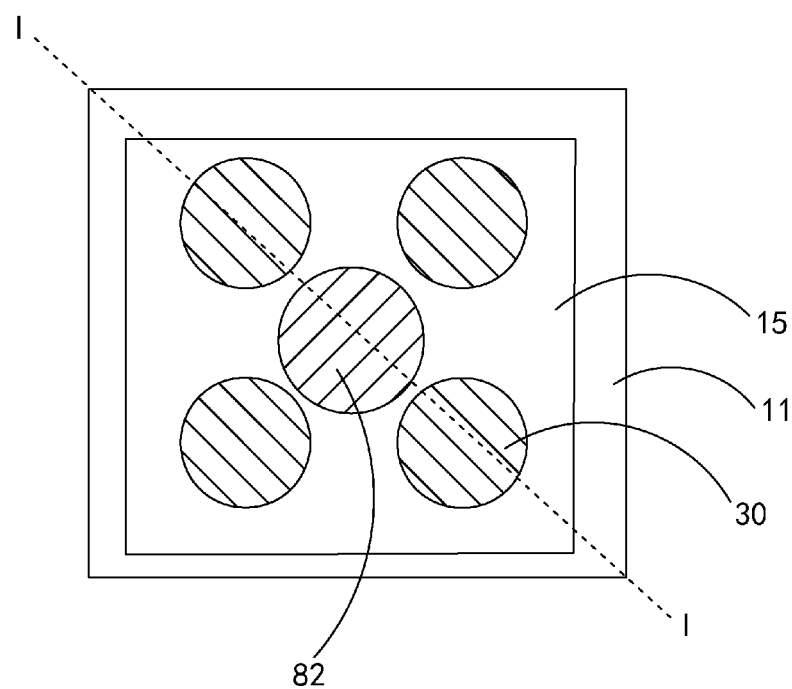
FIG. 20 is a top view of forming a third opening in a method of manufacturing a semiconductor structure according to a first exemplary embodiment.
Figure 21:
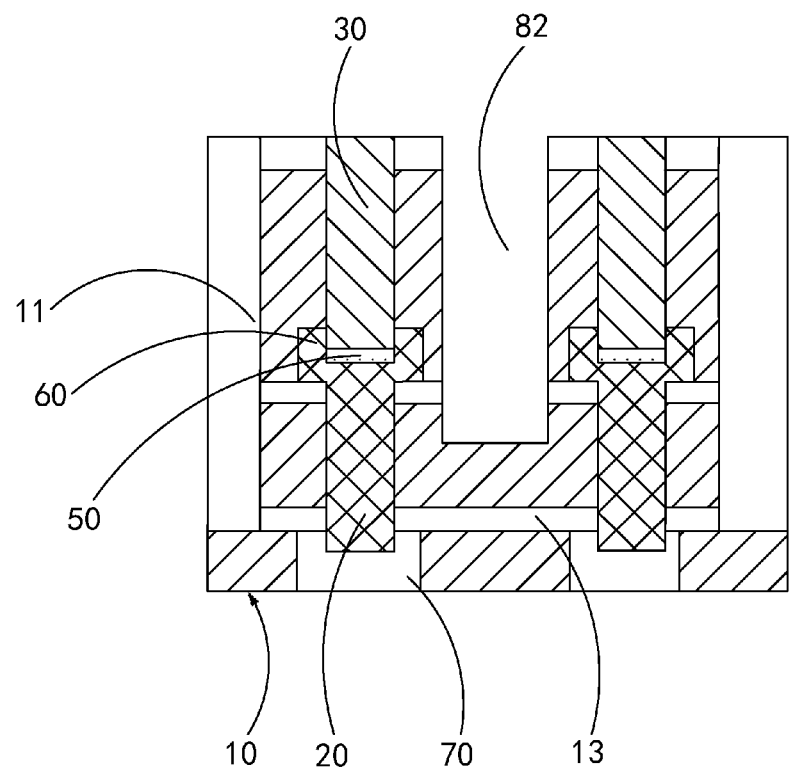
FIG. 21 is a schematic structural diagram of a cross section taken along I-I in FIG. 20.

A mask structure is formed on an upper surface of the protective layer, and patterned etching is performed to form a third opening 82, where the third opening 82 penetrates the third isolation layer 15, the second sacrificial layer 81, the second isolation layer 14, and a part of the first sacrificial layer 80, specifically as shown in FIG. 20 and FIG. 21.

Figure 22:
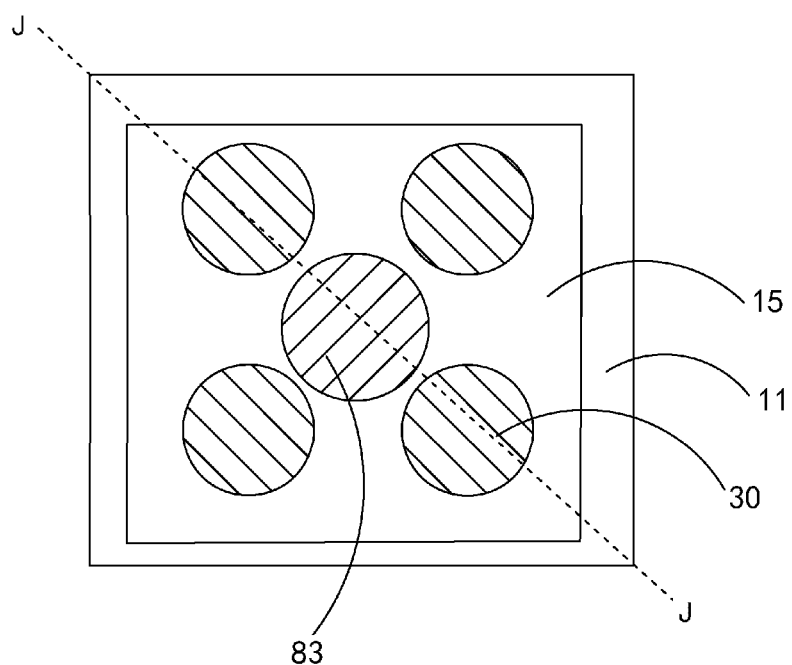
FIG. 22 is a top view of forming a space in a method of manufacturing a semiconductor structure according to a first exemplary embodiment.
Figure 23:
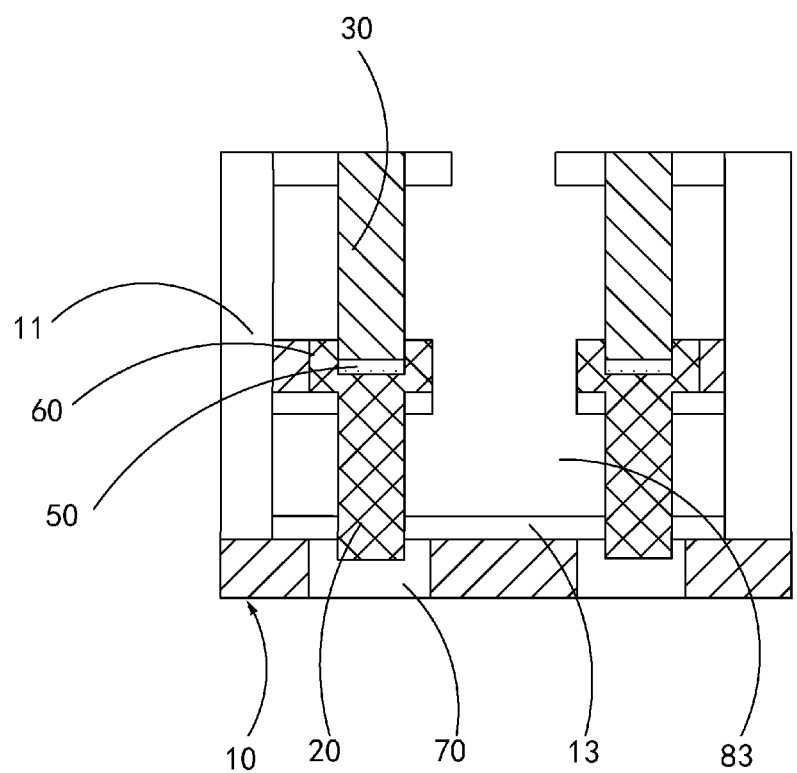
FIG. 23 is a schematic structural diagram of a cross section taken along J-J in FIG. 22.

The first sacrificial layer 80 and the second sacrificial layer 81 are removed through wet etching, to form a space 83, as shown in FIG. 22 and FIG. 23. In this case, outer surfaces of the first transistors 20 and the second transistors 30 are exposed.

Figure 24:
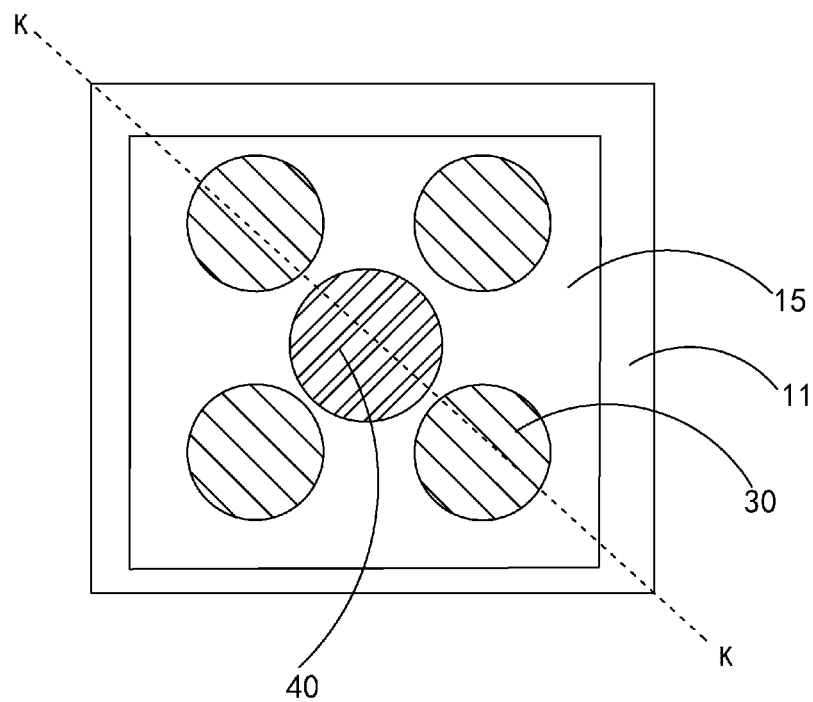
FIG. 24 is a top view of forming a gate structure in a method of manufacturing a semiconductor structure according to a first exemplary embodiment.
Figure 25:
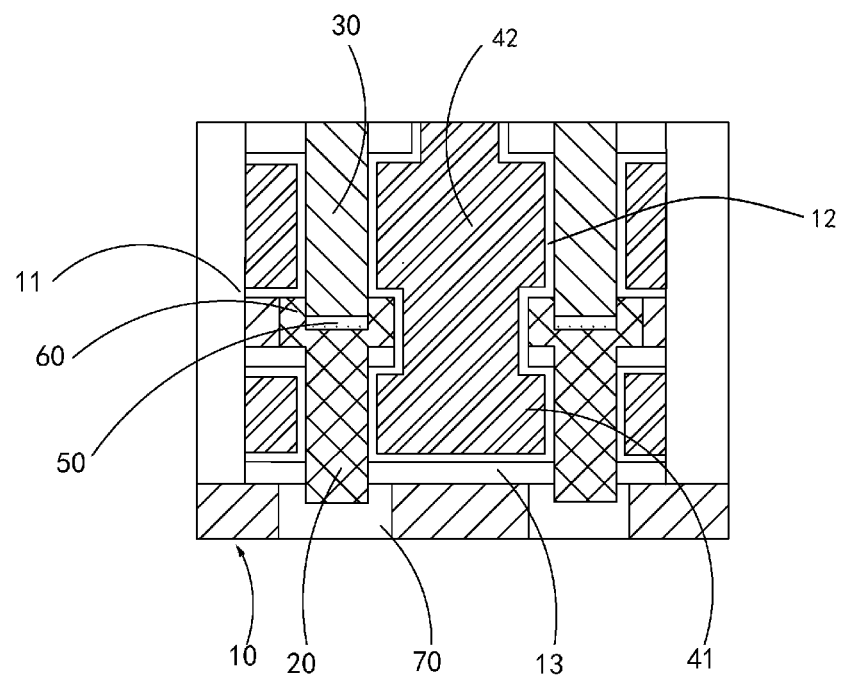
FIG. 25 is a schematic structural diagram of a cross section taken along K-K in FIG. 24.

An oxide layer 12 is formed in the space 83, and a gate structure 40 is formed, where a first gate layer 41 of the gate structure 40 surrounds the first transistor 20, and a second gate layer 42 of the gate structure 40 surrounds the second transistor 30, specifically as shown in FIG. 24 and FIG. 25. The oxide layer 12 is used as a gate oxide layer of the gate structure 40.

Patterned etching is performed, and the electric connection from the first transistors 20 and the second transistors 30 to the first conductive layers 60 and the second conductive layers 70 is implemented through the conductive contact holes 16, to form the semiconductor structure as shown in FIG. 1 to FIG. 3.

It should be noted that, the first isolation layer 13, the second isolation layer 14, and the third isolation layer 15 may all be insulation dielectric layers for protection, and may include materials such as silicon nitride (SiN) and silicon carbon nitride (SiCN).

In an embodiment, a first opening 66 is formed on each of the first conductive layers 60. The first opening 66 does not expose the first transistor 20. A part of the second transistor 30 is formed in the first opening 66. That is, the first transistor 20 and the second transistor 30 are isolated from each other through the first conductive layer 60, thus avoiding direct contact between the first transistor 20 and the second transistor 30.

Optionally, a bottom wall of the first opening 66 is flush with the top of the first transistor 20. In this case, projection of the first transistor 20 and projection of the second transistor 30 on the substrate 10 do not overlap with each other, that is, the first transistor 20 and the second transistor 30 are staggered in the vertical direction.

Figure 26:
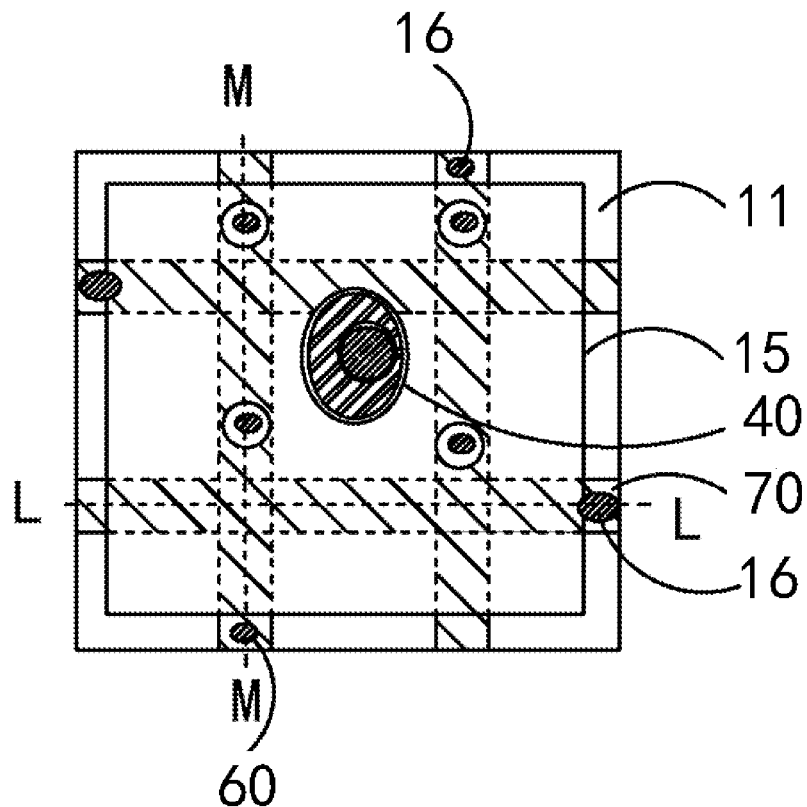
FIG. 26 is a top view of a semiconductor structure according to a second exemplary embodiment.
Figure 27:
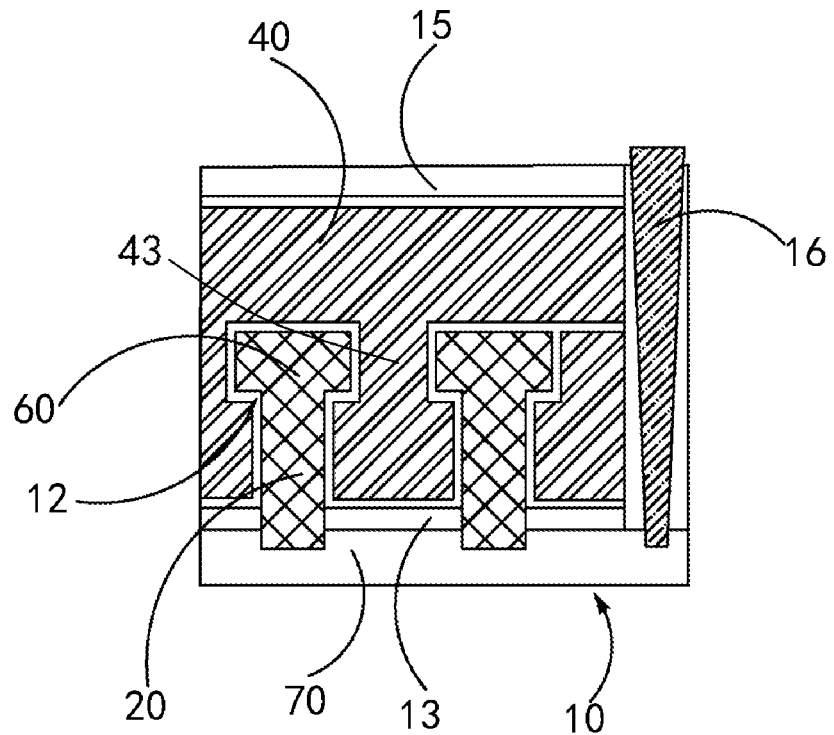
FIG. 27 is a schematic structural diagram of a cross section taken along L-L in FIG. 26.
Figure 28:
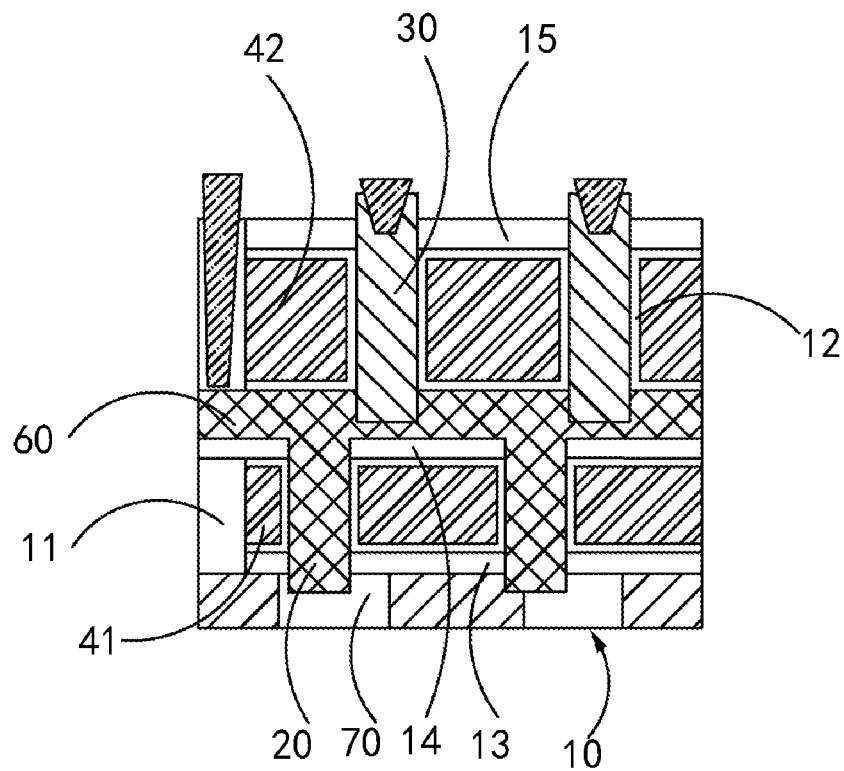
FIG. 28 is a schematic structural diagram of a cross section taken along M-M in FIG. 26.
Figure 29:
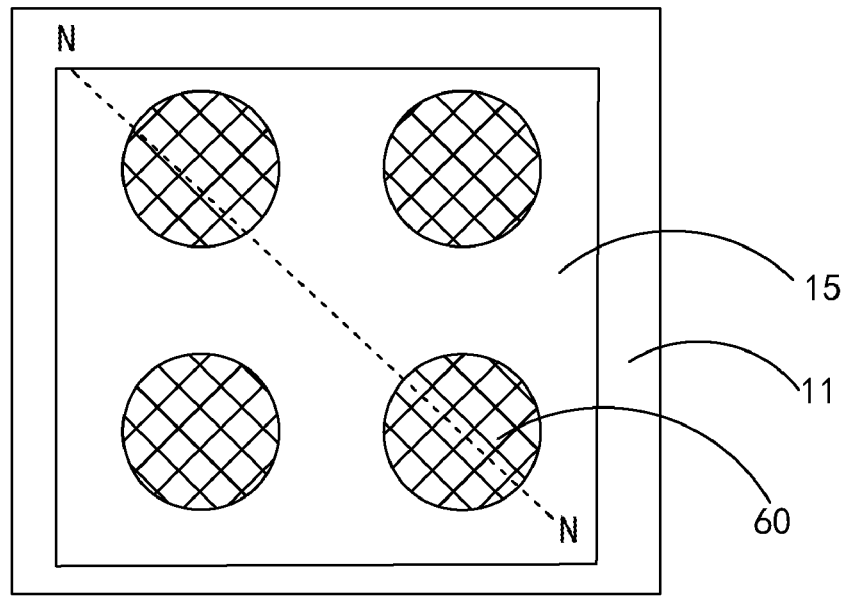
FIG. 29 is a top view of forming first openings in a method of manufacturing a semiconductor structure according to a second exemplary embodiment.
Figure 30:
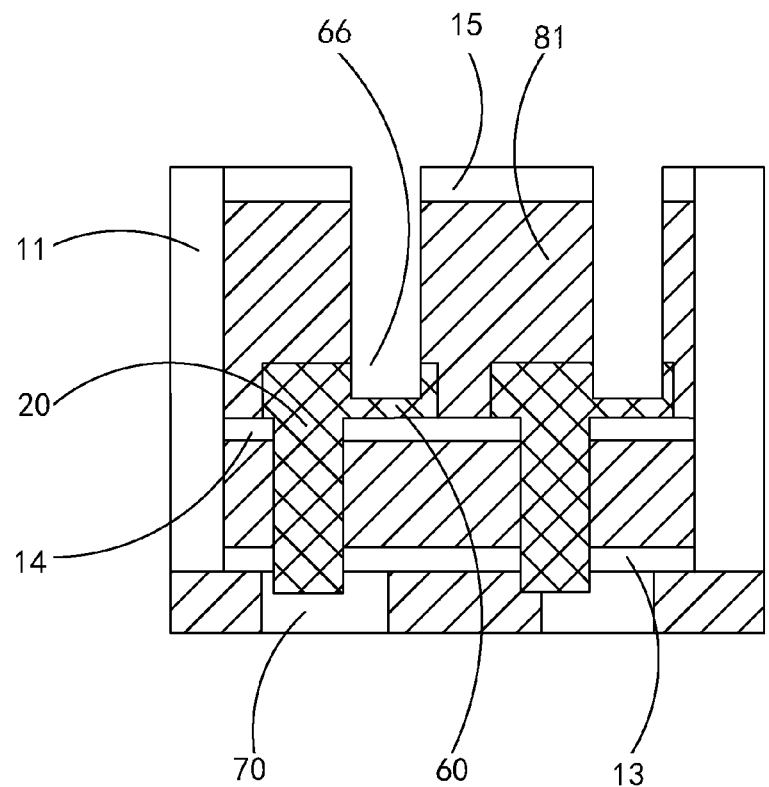
FIG. 30 is a schematic structural diagram of a cross section taken along N-N in FIG. 29.

In the second embodiment of the method of manufacturing a semiconductor structure, a semiconductor structure as shown in FIG. 26 to FIG. 28 is formed. The method of manufacturing a semiconductor structure includes steps as follows:

Compared with the first embodiment, in this embodiment, patterned etching is performed on the basis of FIG. 12 and FIG. 13, to form through holes penetrating the third isolation layer 15 and the second sacrificial layer 81. Each of the through holes runs through a part of the corresponding first conductive layer 60, so as to form a first opening 66 in the first conductive layer 60 without exposing the top of the first transistor 20. That is, the formed first opening 66 is deviated from a position right above the first transistor 20, as shown in FIG. 29 and FIG. 30.

Figure 31:
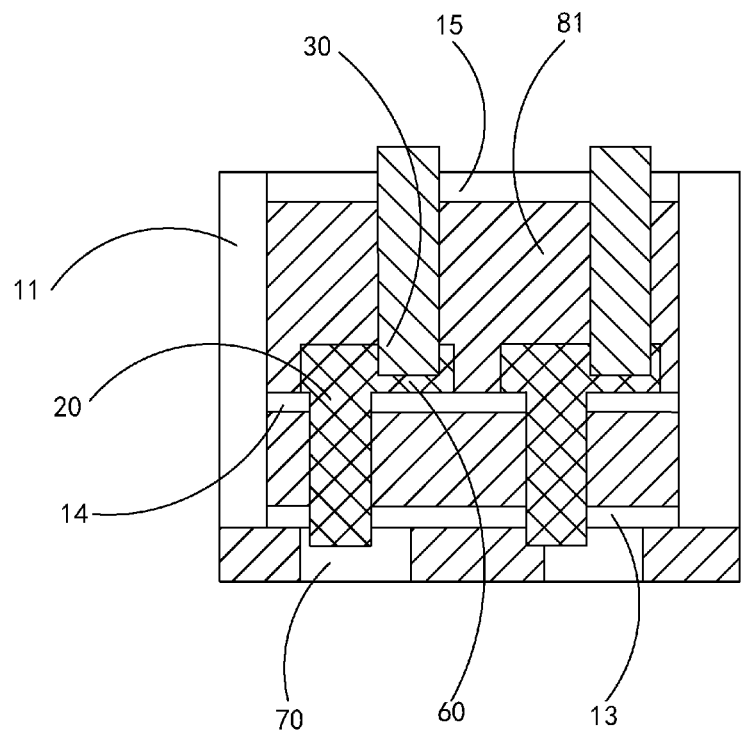
FIG. 31 is a schematic structural diagram of forming a second transistor in a method of manufacturing a semiconductor structure according to a second exemplary embodiment.

Second transistors 30 are formed through in-situ doping or deposition followed by doping, specifically as shown in FIG. 31.

Figure 32:
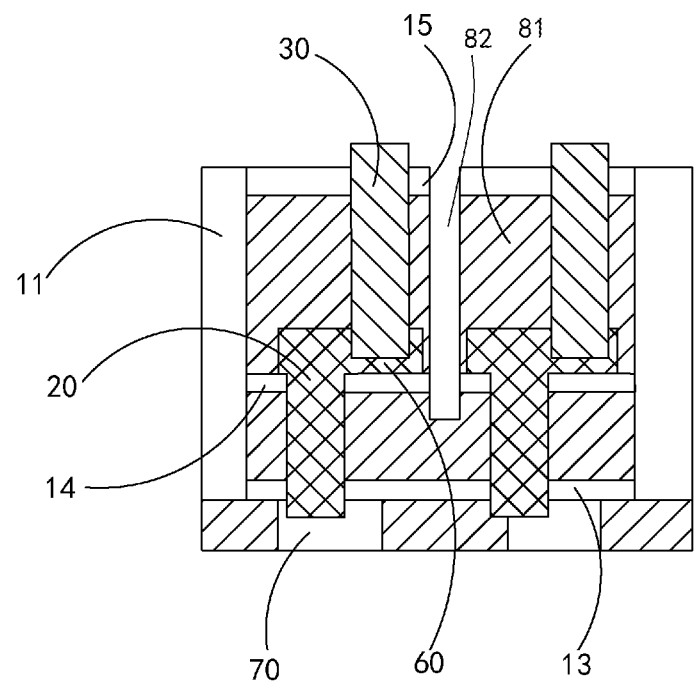
FIG. 32 is a schematic structural diagram of forming a third opening in a method of manufacturing a semiconductor structure according to a second exemplary embodiment.

A mask structure is formed on an upper surface of the protective layer, and patterned etching is performed to form a third opening 82, where the third opening 82 penetrates the third isolation layer 15, the second sacrificial layer 81, the second isolation layer 14, and a part of the first sacrificial layer 80, specifically as shown in FIG. 32.

Figure 33:
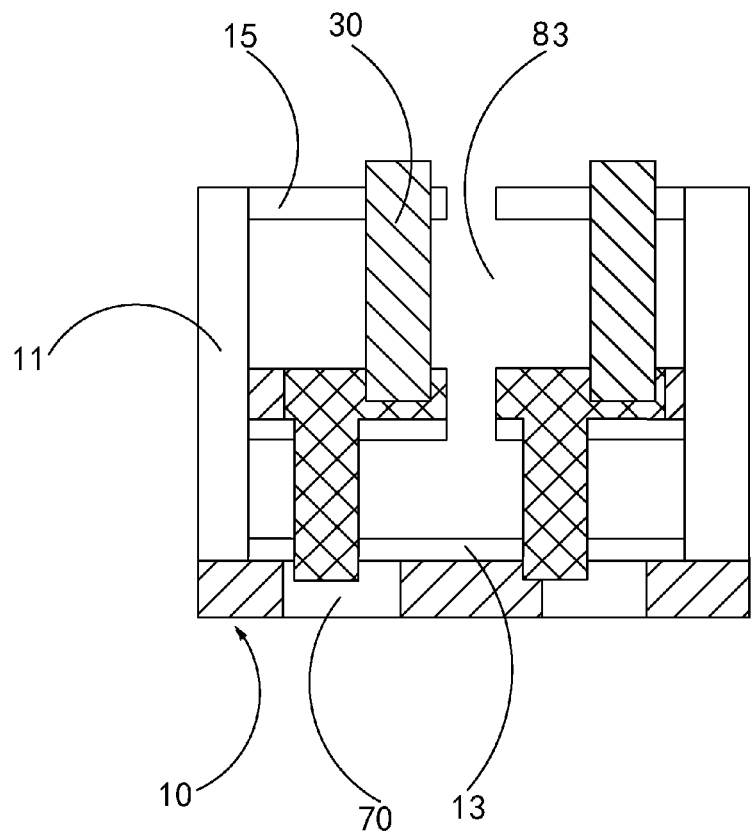
FIG. 33 is a schematic structural diagram of forming a space in a method of manufacturing a semiconductor structure according to a second exemplary embodiment.

The first sacrificial layer 80 and the second sacrificial layer 81 are removed through wet etching, to form a space 83, as shown in FIG. 33. In this case, outer surfaces of the first transistors 20 and outer surfaces of the second transistors 30 are exposed.

Figure 34:
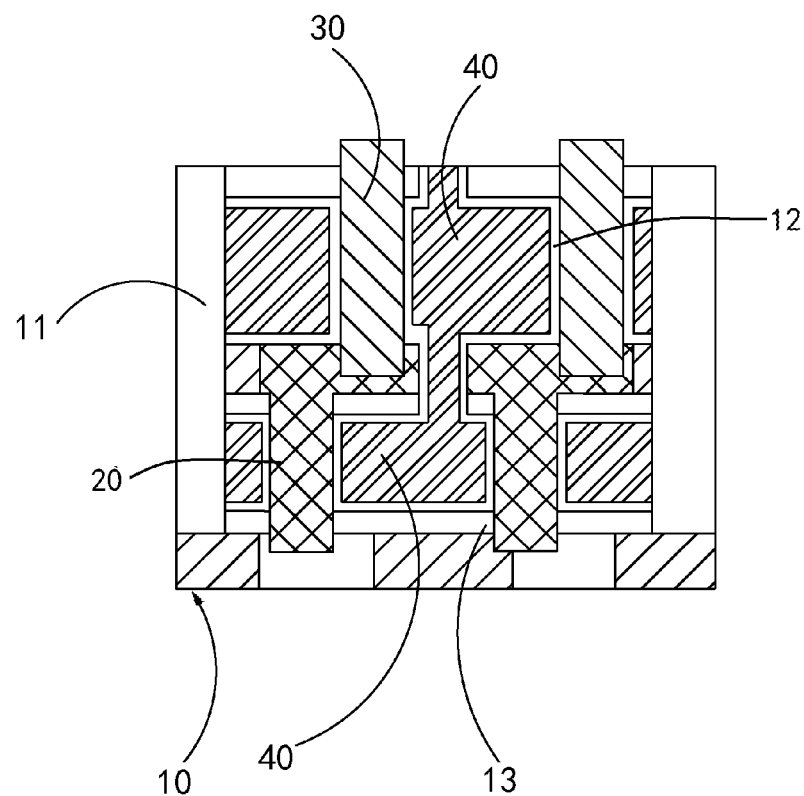
FIG. 34 is a schematic structural diagram of forming a gate structure in a method of manufacturing a semiconductor structure according to a second exemplary embodiment.

An oxide layer 12 is formed in the space 83, and a gate structure 40 is formed, where a first gate layer 41 of the gate structure 40 surrounds the first transistor 20 and a second gate layer 42 of the gate structure 40 surrounds the second transistor 30, specifically as shown in FIG. 34. The oxide layer 12 is used as a gate oxide layer of the gate structure 40.

Patterned etching is performed, and the electric connection from the first transistor 20 and the second transistor 30 to the first conductive layers 60 and the second conductive layers 70 is implemented through the conductive contact holes 16, to form the semiconductor structure as shown in FIG. 26 to FIG. 28.

In the semiconductor structure formed in the first embodiment and the second embodiment, the first conductive layers 60 and the second conductive layers 70 extend along directions of straight line. That is, the first conductive layers 60 extend along a direction of first straight line, and the second conductive layers 70 extend along a direction of second straight line. The first straight line direction and the second straight line direction are both parallel to the substrate 10. The first straight line direction and the second straight line direction may be perpendicular to each other or at a certain angle, which is not limited therein.

Figure 35:
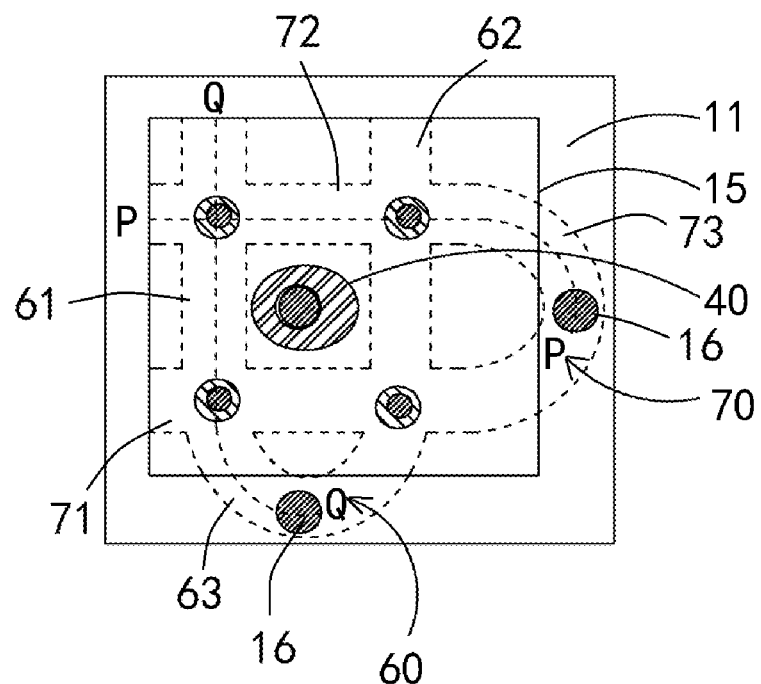
FIG. 35 is a top view of a semiconductor structure according to a third exemplary embodiment.
Figure 36:
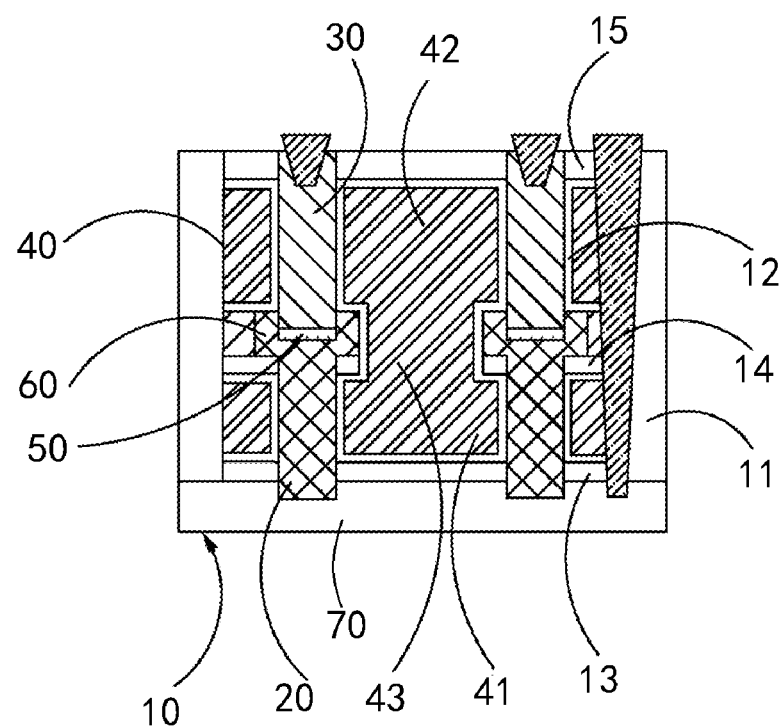
FIG. 36 is a schematic structural diagram of a cross section taken along P-P in FIG. 35.
Figure 37:
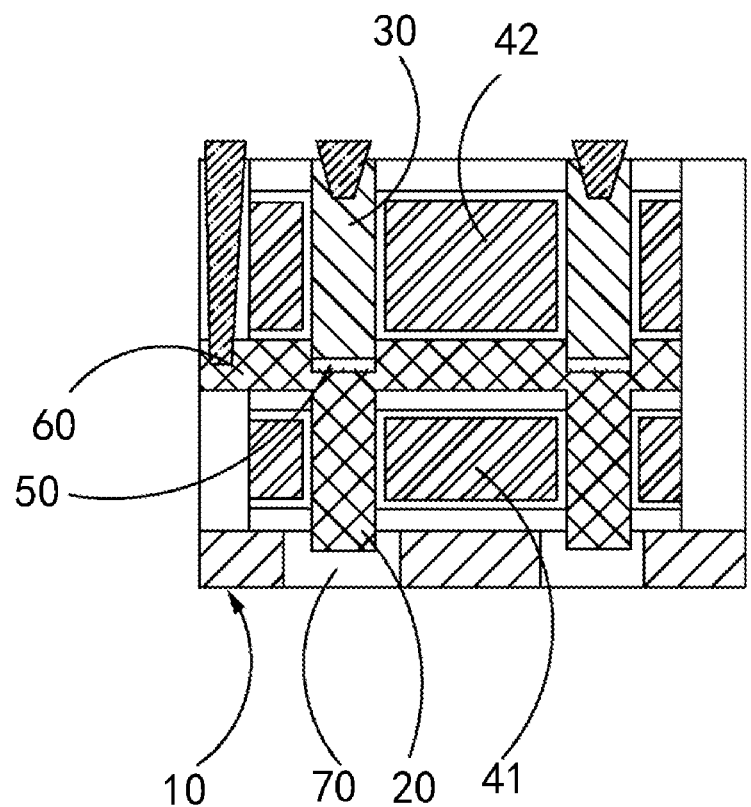
FIG. 37 is a schematic structural diagram of a cross section taken along Q-Q in FIG. 35.
Figure 38:
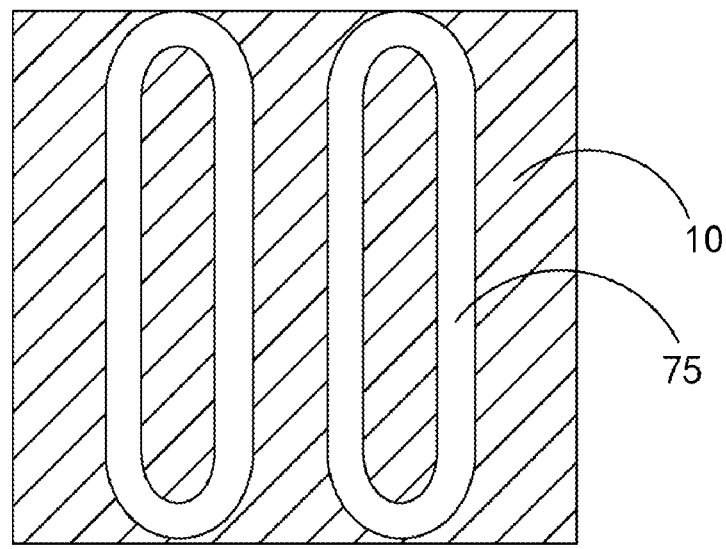
FIG. 38 is a top view of forming second initial conductive layers in a method of manufacturing a semiconductor structure according to a third exemplary embodiment.

In the third embodiment of the method of manufacturing a semiconductor structure, a semiconductor structure as shown in FIG. 35 to FIG. 37 is formed. The method of manufacturing a semiconductor structure includes steps as follows:

Compared with the first embodiment, in this embodiment, second initial conductive layers 75 are formed on the substrate 10, where each of the second initial conductive layers 75 is a closed ring structure, as shown in FIG. 38.

Figure 39:
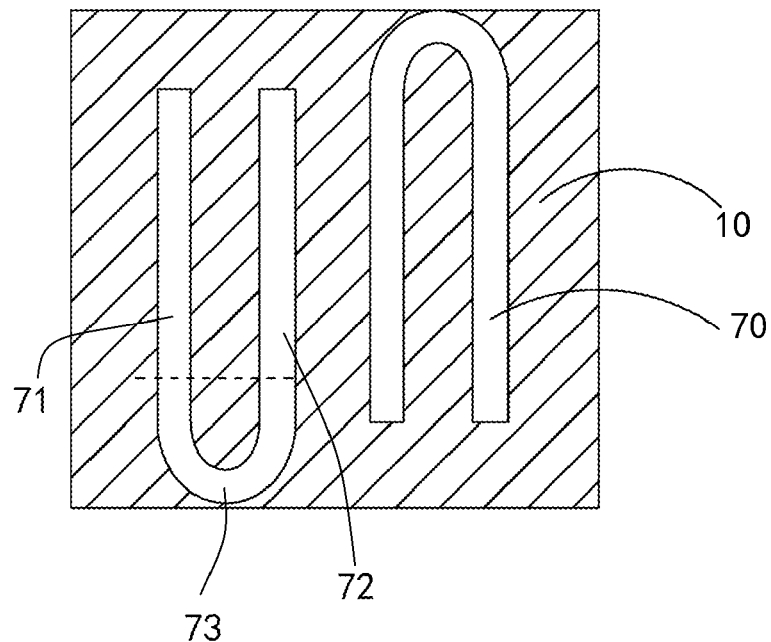
FIG. 39 is a top view of forming second conductive layers in a method of manufacturing a semiconductor structure according to a third exemplary embodiment.

One side of each of the second initial conductive layer 75 is cut off, and the other end remains connected, to form a second conductive layer 70 as shown in FIG. 39. On end remains connected, to facilitate the back-end connecting process, thus not only expanding the process window but also reducing one connecting line.

Figure 40:
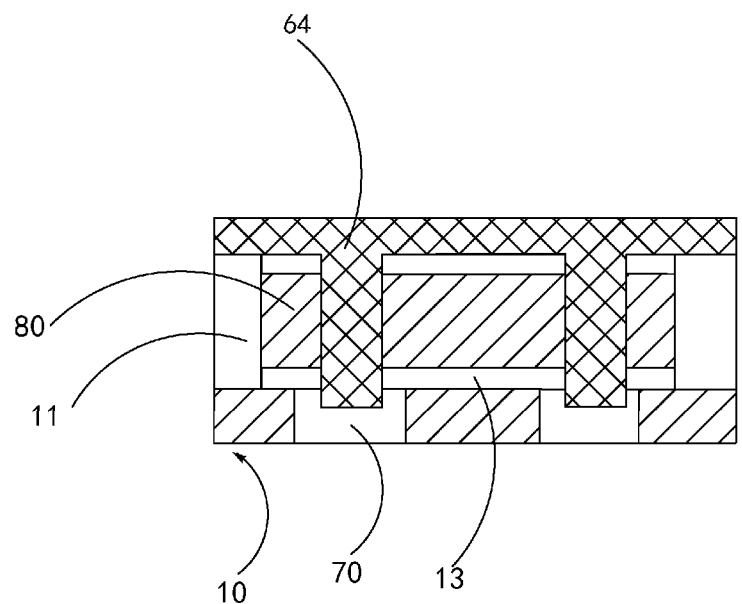
FIG. 40 is a top view of forming first initial conductive layers in a method of manufacturing a semiconductor structure according to a third exemplary embodiment.

On the basis of FIG. 39, the manufacturing process as shown in FIG. 5 to FIG. 9 is used, and first transistors 20 are formed through epitaxial growth based on FIG. 9; first initial conductive layers 64 are formed through epitaxial growth, as shown in FIG. 40. In the process of forming the first initial conductive layers 64, auxiliary processes such as CMP smoothing and patterned etching can be used.

Figure 41:
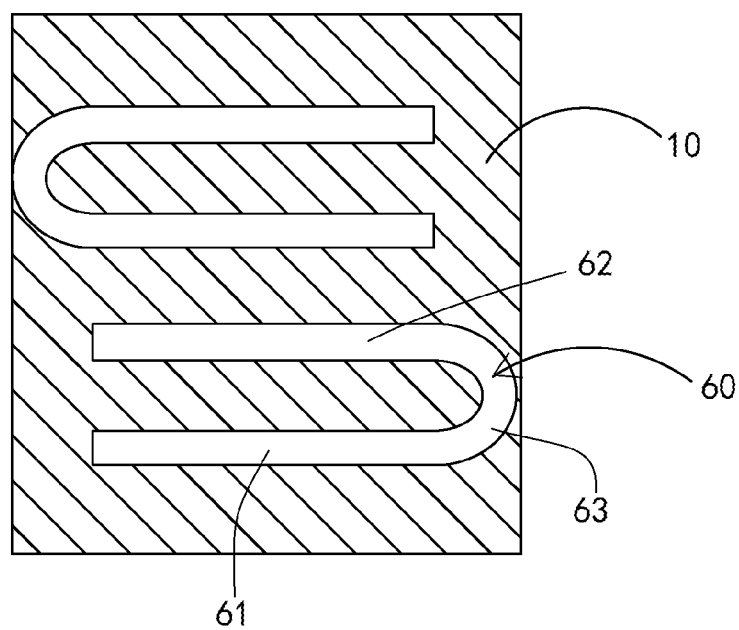
FIG. 41 is a top view of forming first conductive layers in a method of manufacturing a semiconductor structure according to a third exemplary embodiment.

First conductive layers 60 are formed through patterned etching, as shown in FIG. 41. On end remains connected, to facilitate the back-end connecting process, thus not only expanding the process window but also reducing one connecting line.

The subsequent processes are the same as those shown in FIG. 12 to FIG. 25 in the first embodiment, and details are not described herein again. Finally, a structure as shown in FIG. 35 to FIG. 37 is formed.

Figure 42:
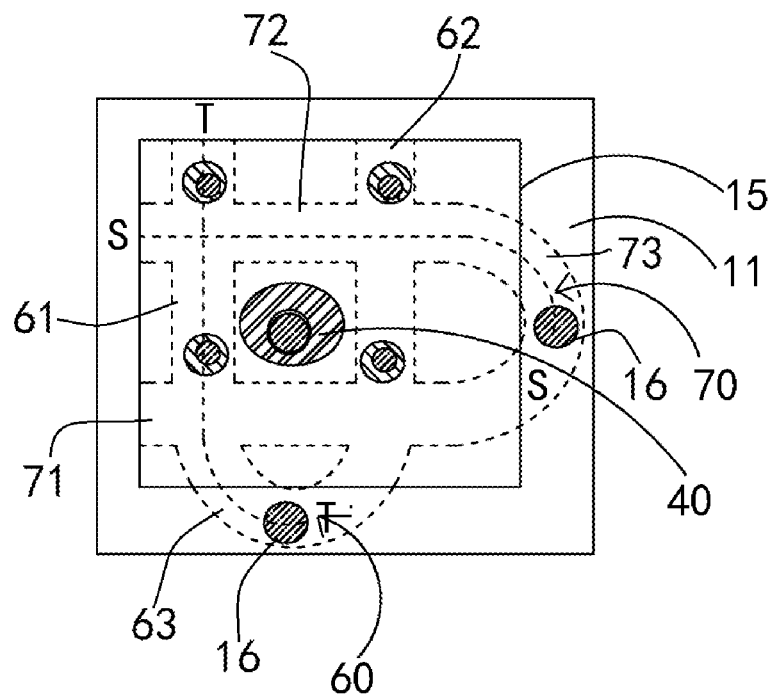
FIG. 42 is a top view of a semiconductor structure according to a fourth exemplary embodiment.
Figure 43:
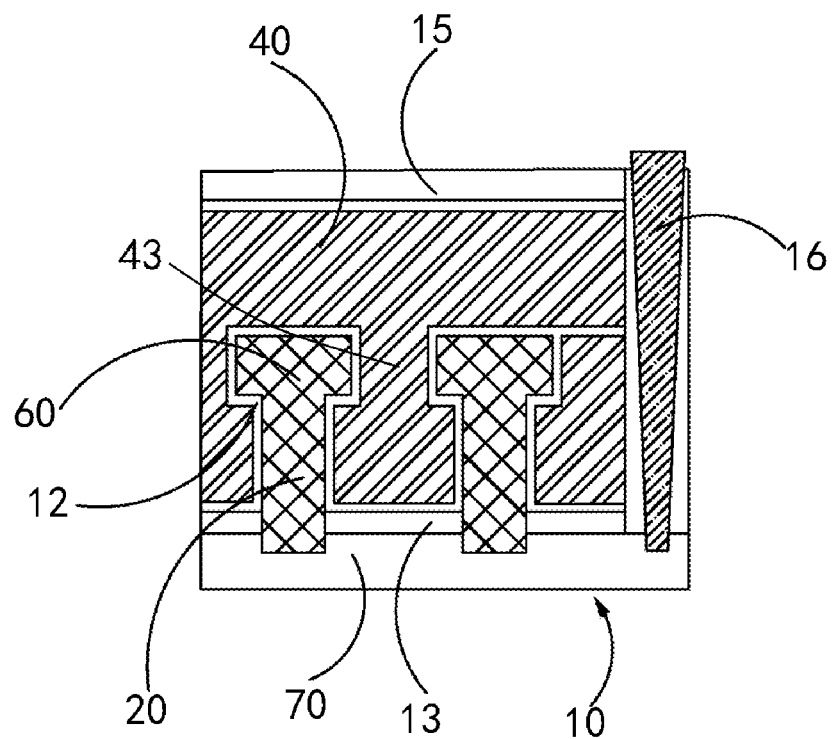
FIG. 43 is a schematic structural diagram of a cross section taken along S-S in FIG. 42.
Figure 44:
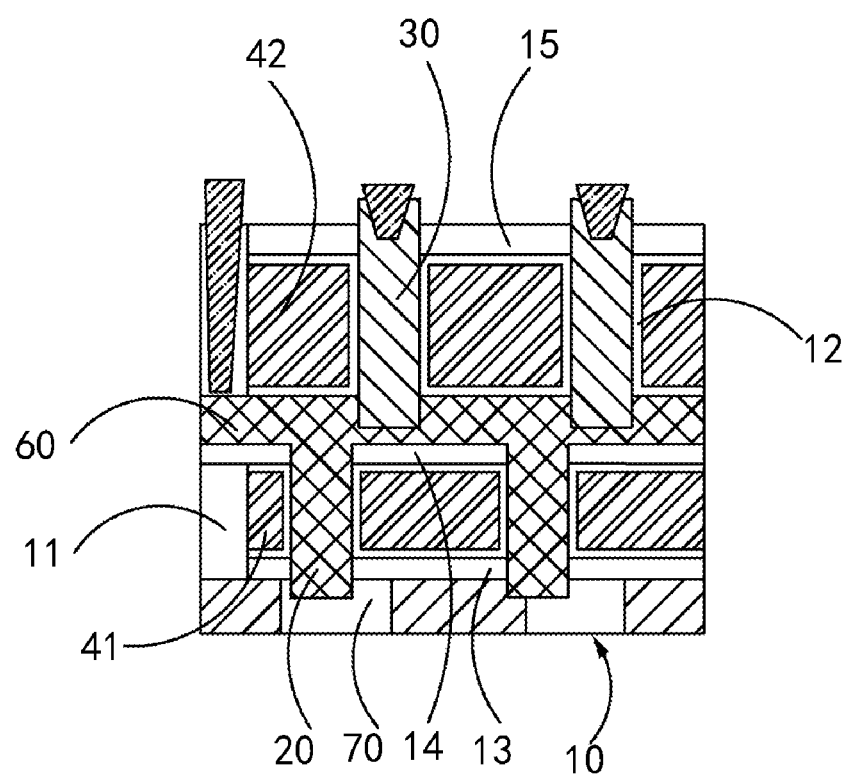
FIG. 44 is a schematic structural diagram of a cross section taken along T-T in FIG. 42.
Figure 45:
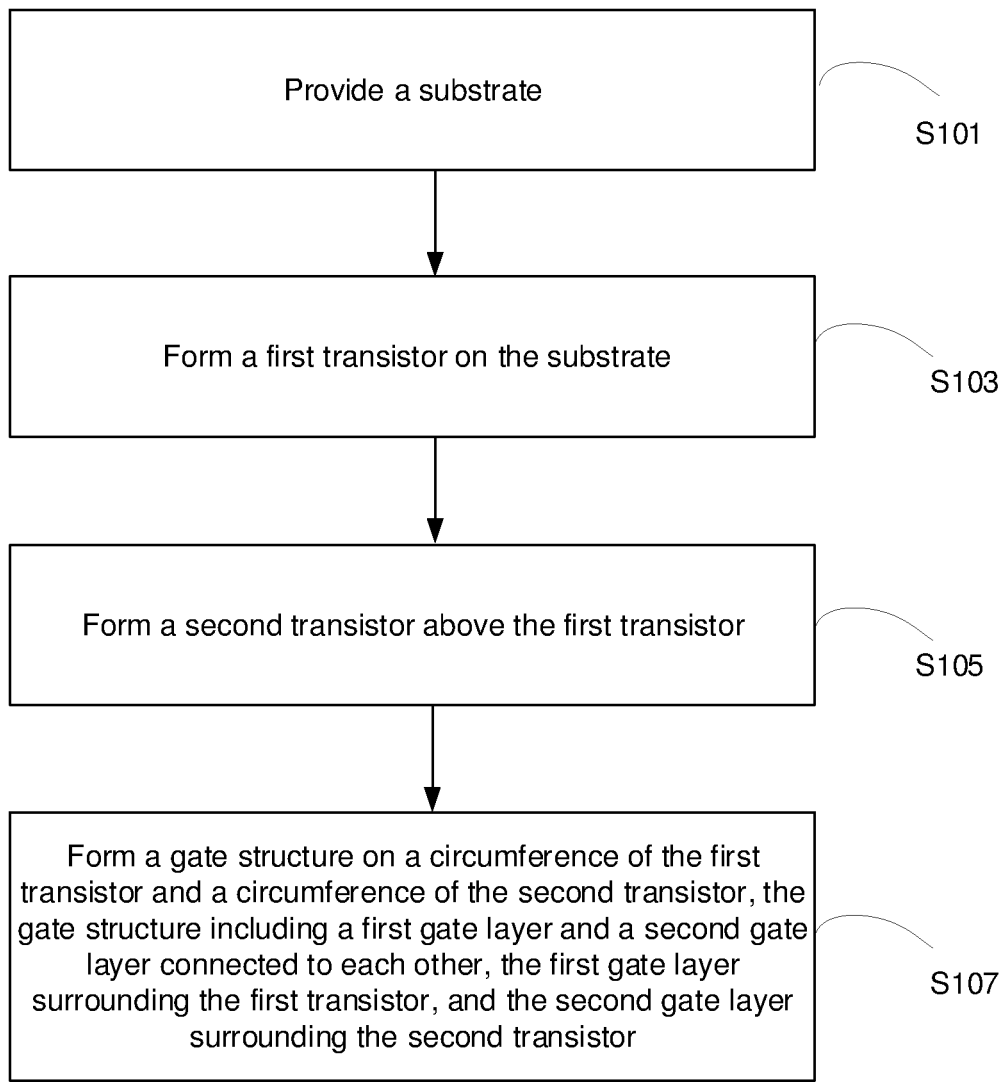
FIG. 45 is a schematic flowchart of a method of manufacturing a semiconductor structure according to an exemplary embodiment.

In the fourth embodiment of the method of manufacturing a semiconductor structure, a semiconductor structure as shown in FIG. 42 to FIG. 44 is formed. The method of manufacturing a semiconductor structure includes steps as follows:

For the manufacturing process of the first conductive layers 60 and the second conductive layers 70 in this embodiment, reference may be made to the third embodiment. For formation of other structures, reference may be made to the process in the second embodiment, and details are not described herein. Compared with the third embodiment in which the second transistors 30 are located right above the first transistors 20 respectively and the conductive connection layers 50 are provided between the first transistors 20 and the second transistors 30, in this embodiment, the second transistors 30 are deviated from the positions right above the first transistors 20 respectively, so as to avoid direct contact between the first transistors 20 and the second transistors 30.

In the semiconductor structure formed in the third embodiment and the fourth embodiment, the first conductive layers 60 and the second conductive layers 70 each form a semi-closed ring structure, such that the number of conductive layers is halved.

The method of manufacturing a semiconductor structure of the present disclosure further increases the length of the conductive channel and reduces the area occupied by the device, forming a CFET structure consisting of vertical transistors, where the conductive channels of the PFET and NFET transistors are stacked vertically together. The conductive channel holes of the PFET and NFET are etched in two separate steps to reduce the depth-to-width ratio of the whole and the process difficulty. The second conductive layers are formed in the silicon substrate, and the first conductive layers, P-channels or N-channels are deposited directly from the silicon substrate through epitaxial growth, which reduces the process difficulty.

An embodiment of the present disclosure provides a semiconductor structure, including: a substrate 10; first transistors 20, located on the substrate 10; second transistors 30, located above the first transistors 20 respectively; and gate structures 40, where each of the gate structures 40 includes a first gate layer 41 and a second gate layer 42, the first gate layers 41 surround the first transistors 20 respectively, and the second gate layers 42 surround the second transistors 30 respectively; an extension direction of each of the first transistors 20 and an extension direction of each of the second transistors 30 are both perpendicular to the substrate 10.

The semiconductor structure according to an embodiment of the present disclosure includes the substrate 10, the first transistors 20, the second transistors 30, and the gate structures 40. Each of the first transistors 20 and each of the second transistors 30 are stacked in the vertical direction; in addition, each of the first transistors 20 and each of the second transistors 30 share one gate structure 40, which increases the length of the conductive channel of the semiconductor structure and also reduces the area occupied by the semiconductor structure, thus improving the performance of the semiconductor structure.

The gate structures 40 each include a first gate layer 41, a second gate layer 42, and a gate connection layer 43. Two ends of the gate connection layer 43 are connected to the first gate layer 41 and the second gate layer 42, thus forming the gate structure 40 shared by the first transistor 20 and the second transistor 30.

The first transistor 20 and the second transistor 30 share the gate structure 40. That is, the first transistor 20, the second transistor 30, and the gate structure 40 form a complementary transistor structure. Optionally, each of the first transistors 20 is a PFET, and each of the second transistors 30 is an NFET; or each of the first transistors 20 is an NFET, and each of the second transistors 30 is a PFET. The first transistor 20, the second transistor 30 and the gate structure 40 form a complementary FET (CFET) structure. The PFET and NFET may be junctionless transistors or junctioned transistors. At least a part of the NFET is made of Si, and at least a part of the PFET is made of SiGe.

In an embodiment, the semiconductor structure further includes oxide layers 12. Each of the oxide layers 12 is used for isolating the first transistor 20 from the gate structure 40 and isolating the second transistor 30 from the gate structure 40. The oxide layer 12 may include materials such as silicon dioxide ($SiO_2$) and silicon carbon oxide (SiOC).

In an embodiment, projection of each of the first transistors 20 and projection of each of the second transistors 30 on the substrate 10 at least partially overlap. That is, at least a part of the second transistor 30 is located right above the first transistor 20. In this case, it is necessary to ensure that the first transistor 20 is electrically connected to, but not in direct contact with the second transistor 30. The first transistor 20 and the second transistor 30 may share a source region or a drain region.

Optionally, the semiconductor structure further includes: conductive connection layers 50, where each of the conductive connection layers 50 is located between each of the first transistors 20 and each of the second transistors 30, to connect the first transistor 20 and the second transistor 30, that is, the first transistor 20 and the second transistor 30 are isolated from each other through the conductive connection layer 50 to avoid direct contact.

Optionally, the semiconductor structure further includes: first conductive layers 60, where each of the first conductive layers 60 is located between each of the first transistors 20 and each of the second transistors 30, the first transistor 20 and the second transistor 30 may be isolated from each other through the first conductive layer 60, that is, the first transistor 20 and the second transistor 30 are both arranged in the first conductive layer 60, while the first conductive layer 60 of a certain thickness is sandwiched between the first transistor 20 and the second transistor 30.

Optionally, with reference to FIG. 1 to FIG. 3 and FIG. 35 to FIG. 37, the second transistor 30 may be located right above the first transistor 20, the top of the first transistor 20 may be directly connected to the conductive connection layer 50, and the bottom of the second transistor 30 may be directly connected to the conductive connection layer 50. This is equivalent to forming a through hole in the first conductive layer 60.

In an embodiment, projection of each of the first transistors 20 and projection of each of the second transistors 30 on the substrate 10 do not overlap with each other, wherein the first transistor 20 is electrically connected to the second transistor 30. That is, the second transistor 30 is deviated from the position right above the first transistor 20. In this case, the first transistor 20 and the second transistor 30 will not be in direct contact.

Specifically, with reference to FIG. 26 to FIG. 28 and FIG. 42 to FIG. 44, the second transistor 30 may be located above the first transistor 20, but deviated from the position right above the first transistor 20. That is, the top of the first transistor 20 and the bottom of the second transistor 30 are both connected to the first conductive layer 60, but are not aligned in the vertical direction.

Optionally, the top of the first transistor 20 may be flush with the bottom of the second transistor 30. However, since the first transistor 20 and the second transistor 30 are not aligned in the vertical direction, the first transistor 20 and the second transistor 30 will not be in direct contact. Alternatively, the top of the first transistor 20 may be higher than the bottom of the second transistor 30. Alternatively, the top of the first transistor 20 may be lower than the bottom of the second transistor 30.

In an embodiment, the semiconductor structure further includes: first conductive layers 60, where each of the first conductive layers 60 is located between each of the first transistors 20 and each of the second transistors 30, and a plane in which an extension direction of the first conductive layer 60 is located is parallel to the substrate 10. The first conductive layer 60 may be used for leading out source regions or drain regions of the first transistor 20 and the second transistor 30. The source regions or drain regions of the first transistor 20 and the second transistor 30 may be formed in the first conductive layer 60.

In an embodiment, the top of the first transistor 20 is located in the first conductive layer 60, and the bottom of the second transistor 30 is located in the first conductive layer 60, that is, the first transistor 20 and the second transistor 30 may share a source region or drain region.

In an embodiment, the semiconductor structure further includes: second conductive layers 70, where the second conductive layers 70 are located in the substrate 10 and connected to the first transistors 20 respectively; a plane in which an extension direction of each of the second conductive layers 70 is located is parallel to the substrate 10. The second conductive layers 70 may be used for leading out source regions or drain regions of the first transistors 20 respectively.

In an embodiment, projection of each of the first conductive layers 60 on the substrate and projection of each of the second conductive layers 70 on the substrate 10 at least partially do not overlap, to ensure that the first conductive layer 60 and the second conductive layer 70 can be connected to the vertically arranged conductive contact hole 16 respectively, and the conductive contact holes 16 will not overlap with each other.

In an embodiment, each of the first conductive layers 60 extends along a direction of first straight line, and each of the second conductive layers 70 extends along a second straight line direction. The first conductive layers 60 and the second conductive layers 70 are both straight conductive wires, specifically as shown in FIG. 1 to FIG. 3 and FIG. 26 to FIG. 28.

Optionally, the first straight line direction and the second straight line direction are at a certain angle, and the angle between the first straight line direction and the second straight line direction may be 90 degrees.

In an embodiment, each of the first conductive layers 60 includes a first segment 61, a second segment 62, and a third segment 63, and two ends of the third segment 63 are connected to the first segment 61 and the second segment 62 respectively, such that a first space is formed on an inner side of the first conductive layer 60; each of the second conductive layers 70 includes a fourth segment 71, a fifth segment 72, and a sixth segment 73, and two ends of the sixth segment 73 are connected to the fourth segment 71 and the fifth segment 72 respectively, such that a second space is formed on an inner side of the second conductive layer 70. Each of the first conductive layers 60 and each of the second conductive layers 70 may be semi-closed ring structures, to reduce the number of formed conductive layers.

It should be noted that the semi-closed ring structure here does not mean that the first conductive layers 60 and the second conductive layers 70 each must include a certain curved structure, but rather emphasizes that the first conductive layers 60 and the second conductive layers 70 each have an opening at one end, i.e., the first conductive layers 60 and the second conductive layers 70 each have an opening. For example, the first conductive layers 60 and the second conductive layers 70 may each enclose an open rectangular cavity.

Optionally, the third segment 63 extends along a first curved line direction, and the sixth segment 73 extends along a second curved line direction. That is, the first conductive layers 60 and the second conductive layers 70 each include partial curved structure, as shown in FIG. 35 to FIG. 37 and FIG. 42 to FIG. 44.

In an embodiment, the semiconductor structure may be obtained by using the foregoing method of manufacturing a semiconductor structure.

Those skilled in the art may easily figure out other implementations of the present disclosure after considering the specification and practicing the content disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and implementations are merely considered as illustrative, and the real scope and spirit of the present disclosure are directed by the appended claims.

It should be noted that, the present disclosure is not limited to the precise structures that have been described above and shown in the accompanying drawings, and can be modified and changed in many ways without departing from the scope of the present disclosure. The scope of the present disclosure is defined by the appended claims.

The invention claimed is:

1. A semiconductor structure, comprising:
a substrate;
a first transistor, located on the substrate;
a second transistor, located above the first transistor; and
a gate structure, the gate structure comprising a first gate layer and a second gate layer, which are connected to each other, the first gate layer surrounding the first transistor, and the second gate layer surrounding the second transistor;
wherein an extension direction of a conductive channel of the first transistor and an extension direction of a conductive channel of the second transistor are both perpendicular to the substrate;
a first conductive layer, the first conductive layer being located between the first transistor and the second transistor, wherein a plane in which an extension direction of the first conductive layer is located is parallel to the substrate;
a second conductive layer, the second conductive layer being located in the substrate and connected to the first transistor, wherein a plane in which an extension direction of the second conductive layer is located is parallel to the substrate;
wherein a projection of the first conductive layer on the substrate and a projection of the second conductive layer on the substrate at least partially do not overlap;
wherein the first conductive layer comprises a first segment, a second segment, and a third segment, and two ends of the third segment are connected to the first segment and the second segment respectively, such that a first space is formed on an inner side of the first conductive layer; and
wherein the second conductive layer comprises a fourth segment, a fifth segment, and a sixth segment, and two ends of the sixth segment are connected to the fourth segment and the fifth segment respectively, such that a second space is formed on an inner side of the second conductive layer.

2. The semiconductor structure according to claim 1, wherein
a projection of the first transistor and a projection of the second transistor on the substrate at least partially overlap.

3. The semiconductor structure according to claim 2, the semiconductor structure further comprising:
conductive connection layer, the conductive connection layer being located between the first transistor and the second transistor to connect the first transistor and the second transistor.

4. The semiconductor structure according to claim 1, wherein
a projection of the first transistor and a projection of the second transistor on the substrate do not overlap with each other; and
the first transistor is electrically connected to the second transistor.

5. The semiconductor structure according to claim 1, wherein
a top of the first transistor is located in the first conductive layer, and a bottom of the second transistor is located in the first conductive layer.

6. The semiconductor structure according to claim 1, wherein
the first conductive layer extends along a direction of first straight line, and the second conductive layer extends along a direction of second straight line.

7. The semiconductor structure according to claim 1, wherein
the third segment extends along a direction of first curved line, and the sixth segment extends along a direction of second curved line.

8. The semiconductor structure according to claim 1, wherein
the first transistor is a PFET, and the second transistor is an NFET; or
the first transistor is an NFET, and the second transistor is a PFET.

9. The semiconductor structure according to claim 1, wherein
the gate structure further comprises a gate connection layer, and two ends of the gate connection layer are connected to the first gate layer and the second gate layer respectively.

* * * * *